(12) United States Patent
Atwater, Jr. et al.

(10) Patent No.: US 10,374,120 B2
(45) Date of Patent: Aug. 6, 2019

(54) HIGH EFFICIENCY SOLAR CELLS UTILIZING WAFER BONDING AND LAYER TRANSFER TO INTEGRATE NON-LATTICE MATCHED MATERIALS

(75) Inventors: Harry A. Atwater, Jr., South Pasadena, CA (US); James M. Zahler, Pasadena, CA (US); Anna Fontcuberta i Morral, Munich (DE); Tom Pinnington, Pasadena, CA (US); Sean Olson, Santa Monica, CA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 600 days.

(21) Appl. No.: 11/357,436

(22) Filed: Feb. 21, 2006

(65) Prior Publication Data
US 2006/0185582 A1 Aug. 24, 2006

Related U.S. Application Data

(60) Provisional application No. 60/657,385, filed on Mar. 2, 2005, provisional application No. 60/654,523, filed on Feb. 18, 2005.

(51) Int. Cl.
*H01L 31/102* (2006.01)
*H01L 31/18* (2006.01)
(Continued)

(52) U.S. Cl.
CPC .......... *H01L 31/1892* (2013.01); *C30B 33/06* (2013.01); *H01L 31/03046* (2013.01);
(Continued)

(58) Field of Classification Search
CPC ............ H01L 31/03046; H01L 31/043; H01L 31/0687; H01L 31/06875; H01L 31/0735; H01L 31/184; H01L 31/1844
(Continued)

(56) References Cited

U.S. PATENT DOCUMENTS 4,094,704 A * 6/1978 Milnes ................. H01L 31/043
136/244
4,105,470 A * 8/1978 Skotheim ............... H01L 31/07
136/249
(Continued)

FOREIGN PATENT DOCUMENTS

EP 0 060 103 9/1982
JP 03-270220 2/1991
(Continued)

OTHER PUBLICATIONS

Zahler et al., "Wafer Bonding and Layer Transfer Processes for a 4-Junction Solar Cell" (Presentation); 29th IEEE Photovoltaic Specialists Conference, New Orleans, USA; May 2002.*
(Continued)

*Primary Examiner* — Jay C Kim

(57) ABSTRACT

A method of making a virtual substrate includes providing a donor substrate comprising a single crystal donor layer of a first material over a support substrate, wherein the first material comprises a ternary, quaternary or penternary semiconductor material or a material which is not available in bulk form, bonding the donor substrate to a handle substrate, and separating the donor substrate from the handle substrate such that a single crystal film of the first material remains bonded to the handle substrate.

9 Claims, 24 Drawing Sheets

(51) Int. Cl.
*C30B 33/06* (2006.01)
*H01L 31/0304* (2006.01)
*H01L 31/0687* (2012.01)
*H01L 31/0735* (2012.01)
*H01L 31/043* (2014.01)

(52) U.S. Cl.
CPC ........ *H01L 31/043* (2014.12); *H01L 31/0687* (2013.01); *H01L 31/06875* (2013.01); *H01L 31/0735* (2013.01); *H01L 31/184* (2013.01); *H01L 31/1844* (2013.01); *H01L 2924/0002* (2013.01); *Y02E 10/544* (2013.01); *Y02P 70/521* (2015.11)

(58) Field of Classification Search
USPC .................. 257/E25.007, 461, 184; 438/455
See application file for complete search history.

(56) References Cited

U.S. PATENT DOCUMENTS

| | | | |
|---|---|---|---|
| 4,474,647 A | 10/1984 | Asselineau et al. | |
| 4,499,327 A | 2/1985 | Kaiser | |
| 4,907,052 A * | 3/1990 | Takada et al. | 257/458 |
| 5,013,681 A | 5/1991 | Godbey et al. | |
| 5,090,977 A | 2/1992 | Strack et al. | |
| 5,217,564 A | 6/1993 | Bozler et al. | |
| 5,223,043 A * | 6/1993 | Olson et al. | 136/249 |
| 5,231,047 A | 7/1993 | Ovshinsky et al. | |
| 5,261,969 A * | 11/1993 | Stanbery | H01L 31/0749 136/249 |
| 5,336,841 A | 8/1994 | Adams | |
| 5,374,564 A | 12/1994 | Bruel | |
| 5,391,257 A | 2/1995 | Sullivan et al. | |
| 5,609,734 A | 3/1997 | Streicher et al. | |
| 5,637,187 A | 6/1997 | Takasu et al. | |
| 5,641,381 A | 6/1997 | Bailey et al. | |
| 5,710,057 A | 1/1998 | Kenney | |
| 5,720,929 A | 2/1998 | Minkkinen et al. | |
| 5,851,894 A | 12/1998 | Ramm | |
| 5,853,497 A * | 12/1998 | Lillington | H01L 31/0687 136/249 |
| 5,877,070 A | 3/1999 | Goesele et al. | |
| 5,882,987 A | 3/1999 | Srikrishnan | |
| 5,914,433 A | 6/1999 | Marker | |
| 5,955,749 A | 9/1999 | Joannopoulos et al. | |
| 6,010,579 A | 1/2000 | Henley et al. | |
| 6,020,252 A | 2/2000 | Aspar et al. | |
| 6,103,597 A | 8/2000 | Aspar et al. | |
| 6,121,504 A | 9/2000 | Kuechler et al. | |
| 6,130,780 A | 10/2000 | Joannopoulos et al. | |
| 6,150,239 A | 11/2000 | Goesele et al. | |
| 6,190,998 B1 | 2/2001 | Bruel et al. | |
| 6,221,738 B1 | 4/2001 | Sakaguchi et al. | |
| 6,225,192 B1 | 5/2001 | Aspar et al. | |
| 6,242,324 B1 | 6/2001 | Kub et al. | |
| 6,303,405 B1 | 10/2001 | Yoshida et al. | |
| 6,303,468 B1 | 10/2001 | Aspar et al. | |
| 6,323,108 B1 | 11/2001 | Kub et al. | |
| 6,328,796 B1 | 12/2001 | Kub et al. | |
| 6,346,458 B1 | 2/2002 | Bower | |
| 6,429,104 B1 | 8/2002 | Auberton-Herve | |
| 6,465,327 B1 | 10/2002 | Aspar et al. | |
| 6,479,371 B2 | 11/2002 | Noda | |
| 6,497,763 B2 | 12/2002 | Kub et al. | |
| 6,504,091 B2 | 1/2003 | Hisamatsu et al. | |
| 6,600,100 B2 * | 7/2003 | Ho | H01L 31/046 136/249 |
| 6,645,833 B2 * | 11/2003 | Brendel | 438/458 |
| 6,680,432 B2 * | 1/2004 | Sharps | H01L 31/03046 136/249 |
| 6,703,144 B2 * | 3/2004 | Fitzgerald | 428/641 |
| 6,756,286 B1 | 6/2004 | Aspar et al. | |
| 6,767,802 B1 * | 7/2004 | Maa et al. | 438/406 |
| 6,784,462 B2 | 8/2004 | Schubert | |
| 6,794,276 B2 | 9/2004 | Letertre et al. | |
| 6,809,044 B1 | 10/2004 | Aspar et al. | |
| 6,815,309 B2 | 11/2004 | Letertre et al. | |
| 6,867,067 B2 | 3/2005 | Ghyselen et al. | |
| 6,908,828 B2 | 6/2005 | Letertre et al. | |
| 6,936,482 B2 | 8/2005 | Auberton-Herve | |
| 6,989,314 B2 | 1/2006 | Rayssac et al. | |
| 7,019,339 B2 | 3/2006 | Atwater et al. | |
| 7,288,430 B2 | 10/2007 | Faure et al. | |
| 7,488,890 B2 * | 2/2009 | Takamoto | H01L 31/03046 136/255 |
| 7,496,124 B2 | 2/2009 | Kozaki et al. | |
| 7,772,484 B2 * | 8/2010 | Li | H01G 9/2027 136/244 |
| 7,812,249 B2 * | 10/2010 | King et al. | 136/255 |
| 8,067,687 B2 * | 11/2011 | Wanlass | 136/249 |
| 2003/0064535 A1 | 4/2003 | Kub et al. | |
| 2003/0213964 A1 | 11/2003 | Flynn et al. | |
| 2003/0218212 A1 | 11/2003 | Lee et al. | |
| 2004/0214434 A1 | 10/2004 | Atwater et al. | |
| 2004/0235268 A1 | 11/2004 | Letertre et al. | |
| 2005/0026394 A1 | 2/2005 | Letertre et al. | |
| 2005/0026432 A1 | 2/2005 | Atwater et al. | |
| 2005/0032330 A1 | 2/2005 | Ghyselen et al. | |
| 2005/0056312 A1 * | 3/2005 | Young | H01L 31/0749 136/258 |
| 2005/0059179 A1 | 3/2005 | Erchak et al. | |
| 2005/0085049 A1 | 4/2005 | Atwater et al. | |
| 2005/0142879 A1 | 6/2005 | Atwater et al. | |
| 2005/0217717 A1 * | 10/2005 | Faris | 136/252 |
| 2005/0275067 A1 | 12/2005 | Atwater et al. | |
| 2006/0060866 A1 | 3/2006 | Tezen | |
| 2006/0166390 A1 | 7/2006 | Letertre et al. | |
| 2006/0202215 A1 | 9/2006 | Wierer et al. | |

FOREIGN PATENT DOCUMENTS

| | | | | |
|---|---|---|---|---|
| WO | WO 01/03172 A1 | | 1/2001 | |
| WO | WO 03/052836 | * | 6/2003 | ........... H01L 31/068 |

OTHER PUBLICATIONS

Mauk et al., "Selectively-grown InGaP/GaAs on silicon heterostructures for application to photovoltaic-photoelectrolysis cells", Journal of Crystal Growth 225 (2001) pp. 359-365.*
Masafumi Yamaguchi, "III-V compound multi-junction solar cells: present and future", Solar Energy Materials & Solar Cells 75 (2003) pp. 261-269.*
Miles, "Photovoltaic solar cells: An overview of state-of-the-art cell development and environmental issues", Progress in Crystal Growth and Characterization of Materials 51 (2005) pp. 1-42.*
Zahler et al., "Wafer Bonding and Layer Transfer Processes for High Efficiency Solar Cells", NCPV and Solar Program Review Meeting (2003) pp. 723-726.*
U.S. Appl. No. 11/004,808, filed Dec. 7, 2004, Atwater et al.
U.S. Appl. No. 11/193,637, filed Aug. 1, 2005, Atwater et al.
U.S. Appl. No. 11/255,194, filed Oct. 21, 2005, Atwater et al.
Curtis Eng et al., "Integration of the UOP/HYDRO MTO Process into Ethylene Plants," 10th Ethylene Producers' Conference, 1998, pp. 54-85.
Bett et al., III-V Compounds for Solar Cell Applications, Appl. Phys. A, 1999, pp. 119-129, vol. 69, Springer-Verlag (published online: Jun. 24, 1999).
Bruel et al., Smart-Cut: A New Silicon on Insulator Material Technology Based on Hydrogen Implantation and Wafer Bonding, Mar. 1997, pp. 1636-1641, vol. 36, Jpn. J. Appl. Phys.
Cheng et al., Electron Mobility Enhancement in Strained-Si n-MOSFETs Fabricated on SiGe-on-Insulator (SGOI) Substrates, IEEE Electron Device Letters, Jul. 2001, pp. 321-323, vol. 22, No. 7.
Dobaczewski et al., Donor Level of Bond-Center Hydrogen in Germanium, Physical Review B, 2004, pp. 245207-1-6, vol. 69.
Georgakilas et al., Wafer-scale Integration of GaAs Optoelectronic Devices with Standard Si Integrated Circuits Using a Low-Temperature Bonding Procedure, Applied Physics Letters, Dec. 2002, pp. 5099-5101, vol. 81, No. 27, American Institute of Physics [Downloaded Oct. 19, 2004].

(56) References Cited

OTHER PUBLICATIONS

Gosele et al., Fundamental Issues in Wafer Bonding, J. Vac. Sci. Technol. A, Jul./Aug. 1999, pp. 1145-1152, vol. 17(4), American Vacuum Society.

Gosele et al., Semiconductor Wafer Bonding. Annu. Rev. Mater. Sci., 1998, pp. 215-241, vol. 28.

Huang et al., SiGe-on-Insulator Prepared by Wafer Bonding and Layer Transfer for High-Performance Field-Effect Transistors, Applied Physics Letters, Feb. 2001, pp. 1267-1269, vol. 78, No. 9, American Institute of Physics.

Tong et al., "Layer Splitting Process in Hydrogen-Implanted Si, Ge, SiC, and Diamond Substrates," Appl. Phys. Lett., vol. 70, No. 11, Mar. 17, 1997, pp. 1390-1392.

Huang et al., Electron and Hole Mobility Enhancement in Strained SOI by Wafer Bonding, IEEE Transactions on Electron Devices, Sep. 2002, pp. 1566-1571, vol. 49, No. 9.

Langdo et al., Strained Si on Insulator Technology: From Materials to Devices, Solid-State Electronics, 2004, pp. 1357-1367, vol. 48, Elsevier Ltd.

Leroy et al., Controlled Surface Nanopatterning with Buried Dislocation Arrays, Surface Science, 2003, pp. 211-219, vol. 545, Elsevier B.V.

Ma et al., Solid-State Reaction-Mediated Low-Temperature Bonding of GaAs and InP Wafers to Si Substrates, Appl. Phys. Lett., Feb. 1994, pp. 772-774, vol. 64, No. 6, American Institute of Physics.

Maleville et al., Smart-Cut® Technology: From 300 mm Ultrathin SOI Production to Advanced Engineered Substrates, Solid-State Electronics, 2004, pp. 1055-1063, vol. 48, Elsevier Ltd.

Morral et al., InGaAs/InP Double Heterostructures on InP/Si Templates Fabricated by Wafer Bonding and Hydrogen-Induced Exfoliation, Applied Physics Letters, Dec. 2003, pp. 5413-5415, vol. 83, No. 26, American Institute of Physics.

Tong et al., Wafer Bonding and Layer Splitting for Microsystems, Adv. Mater., 1999, pp. 1409-1425, vol. 11, No. 17, Wiley-VCH Verlag GmbH.

Tong et al., Layer Splitting Process in Hydrogen-Implanted Si, Ge, SiC, and Diamond Substrates, Appl. Phys. Letter, Mar. 1997, pp. 1390-1392, vol. 70, No. 11, American Institute of Physics.

Tong et al., Hydrophobic Silicon Wafer Bonding, Appl. Phys. Lett., Jan. 1994, pp. 625-627, vol. 64, No. 5, American Institute of Physics.

Tong et al., A "Smarter-Cut" Approach to Low Temperature Silicon Layer Transfer, Appl. Phys. Lett., Jan. 1998, pp. 49-51, vol. 72, No. 1, American Institute of Physics.

Zahler et al., Ge Layer Transfer to Si for Photovoltaic Applications, Thin Solid Films, 2002, pp. 558-562, vol. 403-404, Elsevier Science B.V.

Zahler et al., Wafer Bonding and Layer Transfer Processes for 4-Junction High Efficiency Solar Cells, 29th IEEE Photovoltaic Specialists Conference, New Orleans, USA, (May 2002).

Auberton-Hervé et al., Smart-Cut®: The Basic Fabrication Process for UNIBOND® SOI Wafers, IEICE Trans. Electron, Mar. 1997, pp. 358-363, vol. E80-C, No. 3, The Institute of Electronics, Information and Communication Engineers.

Tracy et al., Germanium-on-Insulator Substrates by Wafer Bonding, Journal of Electronic Materials, 2004, pp. 886-892, vol. 33, No. 8.

Zahler et al., J. Electron Mater., 33(8), (2004), pp. 22-23, (Abstracts K2 and K3).

Akatsu et al., Wafer Bonding of Different III-V Compound Semiconductors by Atomic Hydrogen Surface Cleaning, Journal of Applied Physics, Oct. 2001, pp. 3856-3862, vol. 90, No. 8, American Institute of Physics.

Bruel M., Silicon on Insulator Material Technology, Electronics Letters, Jul. 1995, pp. 1201-1202, vol. 31, No. 14.

Bruel M., Application of Hydrogen Ion Beams to Silicon on Insulator Material Technology, Nuclear Instruments and Methods in Physics Research B, 1996, pp. 313-319, vol. 108, Elsevier Science B.V.

Kim et al., Heterogeneous Silicon Integration by Ultra-High Vacuum Wafer Bonding, Journal of Electronic Materials, 2003, pp. 849-854, vol. 32, No. 8.

Lagnado et al., Integration of Si and SiGe with $Al_2O_3$ (sapphire), Microelectronic Engineering, 2001, pp. 455-459, vol. 59, Elsevier Science B.V.

Taraschi et al., Strained Si, SiGe, and Ge On-Insulator: Review of Wafer Bonding Fabrication Techniques, Solid-State Electronics, 2004, pp. 1297-1305, vol. 48, Elsevier Ltd.

Wiegand et al., Wafer Bonding of Silicon Wafers Covered with Various Surface Layers, Sensors and Actuators, 2000, pp. 91-95, vol. 86, Elsevier Science B.V.

Yamaguchi M., Multi-Junction Solar Cells and Novel Structures for Solar Cell Applications, Physica E, 2002, pp. 84-90, vol. 14, Elsevier Science B.V.

Zahler et al., Wafer Bonded Ge/Si Heterostructures for Photovoltaic Applications, Presentation, MRS 2002 Fall Meeting, 16 pages, (Nov. 2002).

Zahler et al., Wafer Bonded Ge/Si Heterostructures for Photovoltaic Applications, (Presentation), Electronic Materials Conference 2002, 16 pages.

Zahler et al., Wafer Bonded Ge/Si Heterostructures for Photovoltaic Applications, (Abstract and Presentation), MRS 2002 Spring Meeting (Apr. 2002).

Zahler J.M., Materials Integration by Wafer Bonding and Layer Transfer, (Presentation), 13 pages, MRS 2004 Spring Meeting (Apr. 2004).

Zahler et al., The Role of H in the H-Induced Exfoliation of GE Films, (Abstract and Presentation), MRS 2004 Spring Meeting, 16 pages (Apr. 2004).

Zahler et al., Wafer Bonded Expitaxial Templates for GaAs/Si Heterostructures, (Abstract and Presentation), MRS 2003 Spring Meeting, 16 pages, (Apr. 2003).

Zahler et al., Wafer Bonded Expitaxial Templates for GaAs/Si and InP/Si Heterostructures, (Presentation), MRS 2003 Fall Meeting, 15 pages, (Nov. 2003).

Zahler et al., Wafer Bonding Processes for Ultrahigh Efficiency Photovoltaic Applications, (Presentation), MRS 2001 Fall Meeting, (Nov. 2001).

Zahler et al., GE Layer Transfer to Si for Photovoltaic Applications, (Presentation), 14 pages, MRS 2001 Spring Conference, (Jun. 31, 2001).

Zahler et al., Wafer Bonding and Layer Transfer Processes for A 4-Junction Solar Cell, (Presentation) 29th IEEE Photovoltaic Specialists Conference, New Orleans, USA, (May 2002), 1 pg.

Zahler et al., Ge/Si Wafer Bonded Epitaxial Templates for GaAs/Si Heterostructures, (Abstract), MRS 2002 Fall Meeting, (Nov. 2002).

Morral et al., Bonding and Layer Transfer Process of InP on Silicon for the Elaboration of the Botton Double Heterostructure of 4-Junction High Efficiency Solar Cells, (Abstract), MRS 2002 Fall Meeting, (Nov. 2002).

Morral et al., Assessment of Optical and Structural Properties of III-V Semiconductors Grown on InP/Si and Ge/Si Wafer Bonded Epitaxial Templates with Application to a Four-Junction Solar Cell, (Abstract), MRS 2003 Spring Meeting, (Apr. 2003).

Morral et al., Electrical and Structural Characterization of the Interface of Wafer Bonded InP/Si, MRS 2003 Spring Meeting, (Apr. 2003).

Morral et al., The Role of Hydrogen in H-Induced Exfoliation and Layer Transfer on InP, (Abstract), MRS 2004 Spring Meeting, (Apr. 2004).

Weldon et al., "Mechanism of Silicon Exfoliation Induced by Hydrogen/Helium Co-Implantation," Applied Physics Letters, vol. 73, No. 25, Dec. 21, 1998, pp. 3721-3723.

Nell et al, IEEE Trans. Electron. Dev., vol. 34, p. 257, 1987.

U.S. Appl. No. 60/654,523, filed Feb. 18, 2005, Atwater et al.

U.S. Appl. No. 60/657,385, filed Mar. 2, 2005, Atwater et al.

U.S. Appl. No. 11/785,038, filed Apr. 13, 2007, Pinnington et al.

U.S. Appl. No. 12/081,702, filed Apr. 18, 2008, Pinnington et al.

U.S. Appl. No. 12/178,838, filed Jul. 24, 2008, Pinnington et al.

Dong-Sheng et al., 2004 Chinese Phys. Lett. 21, pp. 970-971.

(56) References Cited

OTHER PUBLICATIONS

Edgar, J.H. et al. Ed., chapter C2 in *Properties, processing, and applications of Gallium Nitride and Related Semiconductors*, 1999, No. 23, pp. 507-529.
Han et al. "Monitoring and controlling of strain during MOCVD of AlGaN for UV optoelectronics," MRS Internet J. Nitride Semicond. Res. 4S1, G7.7, 1999, 6 pgs.
Hearne et al., "Stress evolution during metalorganic chemical vapor deposition of GaN," Appl. Phys. Lett. Jan. 18, 1999, vol. 74, No. 3, pp. 356-358.
Hirayama, et. al. In "High-efficiency 352nm quaternary InAlGaN-based ultraviolet light-emitting diodes grown on GaN substrates," Japanese Journal of Applied Physics, vol. 43, No. 10A, 2004, pp. L1241-L1243.
Kamp et al., "GaN homoepitaxy for device applications," MRS Internet J. Nitride Semicond. Res. 4S1, G10.2, 1999, 12 pgs.
McCarthy et al., "GaN HBT: Toward an RF Device," IEEE Transaction on Electron Devices, vol. 48, No. 3, Mar. 2001, pp. 543-551.
Merfeld, et. al., "Influence of GaN Material Characteristics on Device Performance for Blue and Ultraviolet Light-Emitting Diodes," Journal of Electronic Materials, vol. 33, No. 11, 2004, pp. 1401-1405.
Nishida, et. al., "Highly efficient AlGaN-based UV-LEDs and their application as visible light sources," Proceedings of SPIE vol. 4641, 2002, pp. 68-75.
Raghavan et al., "Effect of Ain interlayers on growth stress in GaN layers deposited on (111) Si," Appl. Phys. Lett. 87, 142101, 2005, 3 pgs.
Ren et al., "Wide Energy Bandgap Electronics" p. 59.
Tong et al., "Semiconductor Wafer Bonding: Science and Technology," 1999, pp. 1-15, 48-81, 96-123 and 132-135.
Tong, Q.Y. et. al., "Reversible Silicon Wafer Bonding for Surface Protection: Water-Enhanced Debonding," Journal of the Electrochemical Society, vol. 139, No. 11, Nov. 1992, pp. 1101-1102.
Tong et al., "Layer splitting process in hydrogen-implanted Si, Ge, SiC, and diamond substrates," Appl. Phys. Lett. 70 (11), Mar. 17, 1997, pp. 1390-1392.
Belousov et al., "In situ metrology advances in MOCVD growth of GaN-based materials," Journal of Crystal Growth, 2004, 272:94-99.
Chang et al., "GaAs/InGaAS/AlGaAs MODFETs with a very thin buffer layer and very high transconductances," Journal of Crystal Growth, 2001, 227-228:214-217.
Dadgar et al. "Reduction of stress at the initial stages of GaN growth on Si(111)," Applied Physics Letters, Jan. 6, 2003, 82(1):28-30.
Einfeldt et al., "Strain and crystallographic tilt in uncoalesced GaN layers grown by maskless pendeoepitaxy," Applied Physics Letters, Feb. 11, 2002, 80(6):953-955.
Franke et al,. "Surface quality of InP etched with tertiarybutylchloride in an MOVPE reactor," Journal of Crystal Growth, 2003, 248 :421-425.
Grzegorczyk et al., "Influence of sapphire annealing in trimethylgallium atmosphere on GaN epitaxy by MOCVD," Journal of Crystal Growth, 2005, 283:72-80.
Hsueh, Chun-Hway, "Stress distribution and curvature in graded semiconductor layers," Journal of Crystal Growth, 2003, 258:302-309.

Lavoie et al., "Indium-induced smoothing of GaAs films during MBE growth," Can. J. Phys. (Suppl.), 1996, 74:S49-S53.
Lu et al.,, "Growth of crack-free GaN films on Si(111) substrate by using Al-rich AlN buffer layer," Journal of Applied Physics, Nov. 1, 2004,96(9):4982-4988.
Mochizuki et al., "Influence of in situ HCl gas cleaning on n/p-type GaAs and AlGaAs regrown interfaces in MOCVD," Journal of Crystal Growth, 2005, 273 464-473.
Mullan et al., "Compositional variations in InGaAsP films grown on patterned substrates," Journal of Crystal Growth, 1997, 182:266-274.
Park et al., "Overgrowth on InP corrugations for 1.55 pm DFB LDs by reduction of carrier gas flow in LPMOCVD," Journal of Crystal Growth, 2003, 258:26-33.
Raghavan et al., "In situ observation of coalescence-related tensile stresses during metalorganic chemical vapor deposition of GaN on sapphire," Applied Physics Letters, 2005, 86:261907-1 to 261907-3.
Schulze et al., "Metalorganic vapor phase epitaxy grown InGaN/GaN ligh-emitting diodes on Si(001) substrate," Applied Physics Letters, 2006, 88:121114-1 to 121114-3.
Shimizu et al., "Growth of high-quality GaAs/Si films for use in solar cell applications," Journal of Crystal Growth, 2004, 265:99-106.
Tsuda et al., "GaN strain reduction by growth on compliant GaN-rich GaNP," Applied Physics Letters, 2005, 87:201916-1 to 201916-3.
Yamaguchi et al., "Analysis for dislocation density reduction in selective area grown GaAs films on Si substrates," Appl. Phys. Lett., Jan. 1, 1990, 56(1):27-29.
Yamaguchi et al., "Strain relief by In-doping and its effect on the surface and on the interface structures in (Al)GaN on sapphire grown by metalorganic vapor-phase epitaxy," Applied Surface Science, 2000, 159-160:414-420.
Yamaguchi et al., "Control of strain in GaN using an in doping-induced hardening effect," Physical Review B, Jun. 25, 2001, 64:035318-1 to 035318-5.
Zeng et al., "High-quality metamorphic HEMT grown on GaAs substrates by MBE," Journal of Crystal Growth, 2001, 227-228:210-213.
Zhang et al., "The influence of AlN buffer layer thickness on the properties of GaN epilayer," Journal of Crystal Growth, 2004, 268:24-29.
Zheleva et al.,, "Pendeo-Epitaxy versus Lateral Epitaxial Overgrowth of GaN: A Comparative Study via Finite Element Analysis," Phys. Stat. Sol., 1999, 176:545-551.
Thompson et al., "Microwave-cut silicon layer transfer," Applied Physics Letters, 2005, 87:224103-1 to 224103-3.
Office Action dated May 5, 2009, in copending U.S. Appl. No. 11/785,038, 23 pgs.
Office Action dated Mar. 5, 2009, in copending U.S. Appl. No. 11/408,239, 21 pgs.
Notice of Allowance dated Sep. 21, 2009, in copending U.S. Appl. No. 12/081,702, 20 pgs.
Office Action dated Sep. 2, 2009, in copending U.S. Appl. No. 11/408,239, 10 pgs.

\* cited by examiner

HIGH EFFICIENCY SOLAR CELLS UTILIZING WAFER BONDING AND LAYER TRANSFER TO INTEGRATE NON-LATTICE MATCHED MATERIALS

CROSS-REFERENCE TO RELATED PATENT APPLICATIONS

The present application claims benefit of priority of U.S. provisional application Ser. No. 60/654,523, filed on Feb. 18, 2005, and Ser. No. 60/657,385, filed on Mar. 2, 2005, both of which are incorporated herein by reference it their entirety.

BACKGROUND OF THE INVENTION

The invention is directed to solar cells, such as multi-junction solar cells made by wafer bonding and layer transfer.

There is considerable interest in the design and fabrication of tandem multi-junction solar cells for high efficiency photovoltaics for space-based and terrestrial applications. Multi-junction solar cells consist of two or more p-n junction subcells with band gaps engineered to enable efficient collection of the broad solar spectrum. The subcell band gaps are controlled such that as the incident solar spectrum passes down through the multi-junction solar cell it passes through subcells of sequentially decreasing band gap energy. Thus, the efficiency losses associated with single-junction cells—inefficient collection of high-energy photons and failure to collect low-energy photons—are minimized.

Multi-junction solar cells are typically fabricated using a monolithic, epitaxial growth process that leads to series connected layers that form subcells of the device. Electrical connection between subcells is performed by a heavily doped tunnel junction formed during the growth of the multi-junction structure. Because of the series-wired nature of such cells, it is important for the photo-current generated by solar radiation in each subcell to be closely matched to all other subcells in the multi-junction solar cell structure.

The monolithic growth process imposes significant limitations on the materials that can be incorporated into multi-junction solar cells. More specifically, MBE and MOCVD manufacturing methods require that any deposited layers be substantially lattice matched to the previous layer or underlying substrate, a restriction that significantly constrains both the substrate choice and the available subcell bandgaps. The resulting constraints have a significant impact on both the photoelectric conversion efficiency and specific power of multi-junction solar cells.

SUMMARY OF THE INVENTION

One embodiment of the invention relates to a method of making a virtual substrate which comprises providing a donor substrate comprising a single crystal donor layer of a first material over a support substrate, wherein the first material comprises a ternary, quaternary or penternary semiconductor material or a material which is not available in bulk form, bonding the donor substrate to a handle substrate, and separating the donor substrate from the handle substrate such that a single crystal film of the first material remains bonded to the handle substrate.

Another embodiment of the invention relates to a virtual substrate which comprises a handle substrate and a single crystal donor film of a first material bonded to the handle substrate, wherein the first material comprises a ternary, quaternary or penternary semiconductor material or a material which is not available in bulk form.

DETAILED DESCRIPTION OF THE PREFERRED EMBODIMENTS

Figure 1:
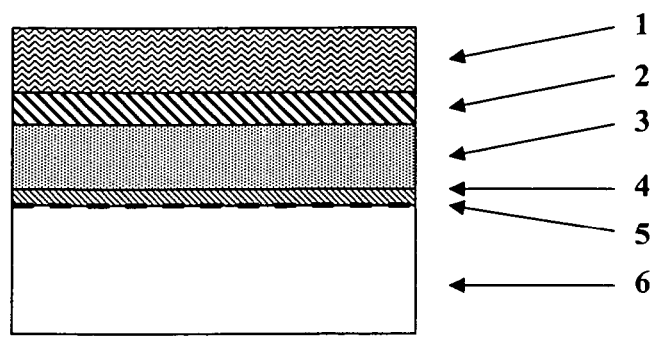
FIGS. 1-30 show schematic side cross sectional views of in-process and completed semiconductor devices according to the embodiments of the invention.

Wafer bonding and layer transfer can overcome these constraints by enabling the integration of otherwise incompatible materials to form novel multi-junction solar cell structures. In addition, it can enable the integration of non-lattice matched materials not available in bulk crystalline form.

As described above, wafer bonding enables the fabrication of novel multi-junction solar cells by expanding the opportunity to integrate non-lattice matched III-V semiconductors into a single monolithic structure. The materials of interest for the subcells of new multi-junction solar cell designs are III-V semiconductor thin films that can be grown with high quantum efficiency. These materials include, but are not limited to, InGaAs, GaAs, AlGaAs, InGaP, InP, InGaAsP. More broadly, these subcells can be comprised of any binary, ternary, quaternary, penternary (i.e., five components) combination of B, Al, Ga, In, N, P, As, and Sb. In addition to the III-V semiconductors, group IV semiconductors can be used as active subcells in a wafer-bonded multi-junction solar cell. In particular, Si and Ge are candidate materials. Binary group IV alloys comprised of C, Si, Ge, and Sn are also candidates for subcell material.

In addition to integration of III-V and group IV subcells into monolithic multi-junction solar cell structures, wafer bonding enables the fabrication of these devices on alternative substrates. These alternative substrates offer the benefits of reduced cost and/or higher performance. In addition, alternative substrates are not constrained by the lattice-matching requirement of conventional substrates used in epitaxial growth, and moreover need not be comprised of single-crystal materials. Examples of alternative substrates include: single-crystal and poly-crystalline wafers of silicon, chosen for their low cost, relatively low density, and high thermal conductivity; and sapphire, whose thermal expansion coefficient is closely matched with some III-V material compositions. Non-crystalline substrate materials can also be used, and include various glasses and ceramics which offer a combination of low cost and close thermal matching. In the case of optically transparent substrate materials such as glass or sapphire, the alternative substrate could act as both a base structure during fabrication as well as a cover glass during final operation.

Previous work on the use of wafer bonding and layer transfer in the development of high efficiency photovoltaics has centered on the creation of virtual substrates comprised of a handle substrate and an 'epitaxial template' or device layer that forms the starting layer (and sets the initial lattice constant) for monolithic epitaxial growth processes. These epitaxial templates have generally been comprised of thin films transferred from bulk crystal substrates. However for economic and performance reasons it may be desirable to create a virtual substrate where the epitaxial template layer is comprised of a material that is not readily available in bulk form, or where the bulk form of the material is prohibitively expensive or is difficult to use in a wafer bonding and layer transfer process.

Such virtual substrates would offer significant advantages over virtual substrates made from crystalline materials available in bulk form. Specifically, they could mitigate or eliminate the need to use transitional layers and other metamorphic approaches to integrate bandgap-engineered alloys (which may possess lattice constant that do not match any materials readily available in bulk form) into monolithically grown multi-junction solar cells.

The embodiments of the invention provide structures for 2-, 3-, 4- and 5-junction cells fabricated by wafer bonding and subsequent layer transfer and a method for creating virtual substrates for ternary or quaternary semiconductors or for materials not available in bulk form. For clarity, the structures used to produce the epitaxial donor films are defined below.

An epitaxial donor layer is a layer of material deposited onto a support substrate that in subsequent processing steps will be transferred to a handle substrate in order to form a virtual substrate.

An epitaxial donor film (also referred to as an epitaxial template or device layer or film) is the portion of the epitaxial donor layer that is transferred to the handle substrate to form the virtual substrate.

A virtual substrate is a structure comprised of a handle substrate bonded to the epitaxial donor film which forms the starting layer (and sets the initial lattice constant) for monolithic epitaxial growth processes.

A support substrate is the substrate upon which the epitaxial donor layer is grown.

An epitaxial donor substrate or structure is a structure comprised of an epitaxial donor layer and a support substrate. Examples of such substrates are given in FIGS. 8, 9, and 10.

Note that the structures described herein are intended to represent samples of the more general concepts disclosed and are not intended to limit the scope of this disclosure. The virtual substrates, epitaxial donor substrates, and processes described herein are relevant to multiple areas of compound semiconductor manufacturing, including, but not limited to, LEDs, RF power amplifiers, photodetectors, optoelectronics, and integrated logic/compound semiconductor devices.

Improved Two-Junction Cell Using Wafer Bonding and Layer Transfer of an InGaAs Thin Film At present, most high efficiency two-junction cells for space power applications are comprised of a GaInP top cell and a GaAs bottom cell atop a Ge substrate. The band gaps of these materials are in the range of 1.39-1.43 eV and 1.7-1.8 eV for the top and bottom cells respectively, which are not optimal for a two-junction AM0 design. Instead, optimal bandgaps for a two-junction cell at AM0 typically fall in the ranges of 1.1-1.2 and 1.7-1.8 eV, respectively. Note that the precise values of the optimal bandgaps will in general depend on the interplay of materials properties and anticipated operating conditions.

While an InGaAs bottom cell (with an indium content of ~10-17%) and a GaInP top cell could offer a more optimal range of band gaps, lattice matching requirements prevent the growth of such a layer without the use of a metamorphic layer. Unfortunately, such metamorphic layers tend to significantly increase the manufacturing cost of the cell and also negatively impact the quality of the grown layers, which reduces cell efficiency. Consequently, the bandgaps of the top and bottom cells in commercially available 2-junction cells are not optimal for photoelectric conversion efficiency.

To overcome these limitations, a process may use wafer bonding and layer transfer of an InGaAs epitaxial donor film grown on a GaAs, a Ge, or a virtual substrate, onto a handle substrate that provides the mechanical support for the film during subsequent steps of the manufacturing process. In effect, the transferred film becomes the epitaxial template/device layer discussed in the prior art. An advantage of the two-junction cell created via this process is that the bandgaps for the top and bottom cell can be optimized independently of the lattice constant of the handle substrate.

In the case where a virtual substrate is used for the donor layer growth, the lattice constant of the substrate can be selected to match that of the InGaAs donor layer, as will be described below. In the case where the InGaAs donor layer is grown on a lattice-mismatched substrate such as GaAs or Ge, metamorphic growth techniques can be used to allow relaxation of the InGaAs layer to its unstrained lattice constant. Any residual surface roughness resulting from the metamorphic growth process can be removed prior to the bonding step, for example using a chemical mechanical polish. In this latter case, the resulting polished epitaxial donor layer could also be transferred to other support substrates in order to provide an epitaxial template for additional epitaxial donor layer material growth with only a limited need for additional polishing steps. In any of these cases, the resulting unstrained and low surface-roughness layer of InGaAs can then be bonded and transferred to the handle substrate.

This handle substrate can be comprised of any number of materials chosen for their coefficient of thermal expansion, thermal conductivity, optical transparency, electrical conductivity, and/or cost. Typical handle substrates include Ge, GaAs, sapphire, silicon, engineered ceramic sheets, and other substrates to be discussed in detail below. For example, the handle substrate may comprise non-single crystal materials, such as polycrystalline or amorphous materials, as well as single crystal materials.

Note that the composition of the bonded epitaxial donor film material can be selected such that its lattice constant at the growth temperature of the device is optimal for the growth of the actual device layers on the virtual substrate. For example it may be the case that the thermal expansion of the handle substrate is lower than that of the bonded film, and it is desired that the bonded film be lattice matched with the bottom cell material at the growth temperature of the bottom cell. In this case the optimal composition of the donor material is such that its lattice constant is slightly larger at room temperature than that of the desired bottom cell material. As a specific example, consider the case where the epitaxial donor material is $In(x)Ga(1-x)As$, the handle substrate material is silicon, the growth temperature is 600 C and the temperature at which the donor film is transferred to the handle substrate is 300 C. In this case, if the composition of the $In(x)Ga(1-x)As$ donor layer is $x=0.16$, then at the growth temperature the epitaxial template layer will have a lattice constant corresponding to $In(x)Ga(1-x)As$ where $x$ is approximately 0.15.

Once the film has been transferred onto the handle substrate, an optimized InGaAs subcell is grown followed by an optimized GaInP or InGaAlP top cell. The final structure is shown in FIG. 1. FIG. 1 is a schematic of an optimized 2-junction solar cell comprised of an InGaAs bottom cell 3 and a GaInP top cell 1 on a handle substrate 6. The cell is made by wafer bonding and layer transfer of an InGaAs donor film or epitaxial template 4 onto the handle substrate 6. The bonded interface 5 may be thermally and electrically conductive as well as optically transparent in some implementations. A wafer bonded tunnel junction 2 may be used to connect the top and bottom cells.

Note that by eliminating the need to lattice match the device layer to the handle substrate, it become possible to deposit an InGaAs film that possesses an optimal bottom-cell bandgap. In addition, the lattice spacing of this InGaAs film is closely matched to a composition of GaInP that has an optimal or nearly optimal bandgap for the top cell. The bandgap of the top cell can be further optimized by incorporating a small amount of strain in the GaInP material, or by using an appropriate composition of InGaAlP. In this way, both the bottom cell and top cell material can be semi-independently optimized to achieve a truly optimized two-junction cell design. Detailed balance models (e.g. Nell et al, IEEE Trans. Electron. Dev., Vol. 34, page 257, 1987) suggest that the conversion ratio of this cell is likely to be in the range of 34-35%.

As noted, the precise values for the bandgaps can be optimized for the specific device application. For example, the material band gaps for an optimized two-junction cell operating at AM0 conditions fall in the range of 1.1 eV to 1.2 eV for the bottom cell $In(x)Ga(1-x)As$ film and 1.7 eV to 1.8 eV for the $In(x)Ga(y)Al(1-x-y)P$ top cell. The lattice constant corresponding to these material compositions is in the range of 5.7 Å to 5.74 Å for both the top and bottom cells.

It should be noted that the final structure makes use of a bonded interface between the transferred InGaAs film and the handle substrate. In some implementations, this bonded interface may be comprised of a heavily doped tunnel junction. In addition, in some implementations, this interface will be optimized for high thermal and electrical conductivity as well as high optical transparency using a hydrophobic bonding process as described in U.S. application Ser. No. 10/125,133. A heavily doped tunnel junction can also be provided at the interface of the top and bottom subcells.

Figure 2:
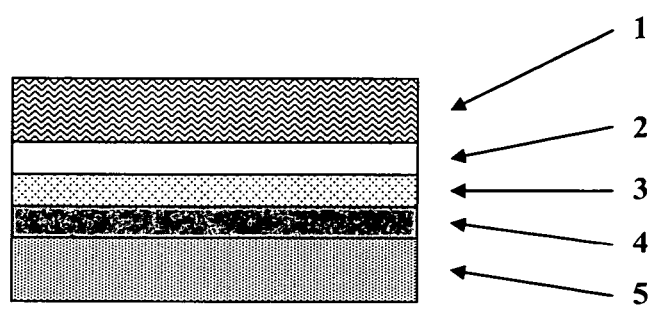

A representative wafer bonded tunnel junction structure is illustrated in FIG. 2. In FIG. 2, a heavily doped tunnel junction 2 is located between the top 1 and the bottom cells 3. A wafer bonded tunnel junction 5 is located between the donor film 4 and the handle substrate 6.

Improved 2-Junction Cell Utilizing InAlAs Top Cell on an InGaAsP Bottom Cell

An alternative design for an optimized two junction structure can be obtained by using an InAlAs top cell rather than the GaInP structure mentioned previously and a InGaAsP bottom cell. In this multi-junction solar cell, the InAlAs top cell possesses a bandgap close to 1.7 and the InGaAsP bottom cell a bandgap close to 1.2 eV, resulting in an optimal two junction design. For this cell, the epitaxial donor layer may be comprised of a lattice-matched InGaAs or InGaAsP epitaxial donor layer. As with the previously described cell, the process described herein enables the fabrication of the high quality layers that this structure is comprised of without the use of metamorphic layers that could both increase cost and negatively impact cell performance.

Any suitable composition ratios for the InAlAs top cell and for the InGaAsP bottom cell may be used. The top and bottom cell bandgaps fall in the ranges of 1.6 eV to 1.8 eV and 1.1 to 1.3 eV respectively. The lattice constant for both subcells falls in the range of 5.83 Å to 5.87 Å.

Improved 2-Junction Cell Utilizing GaInP on Active Silicon

Figure 3:
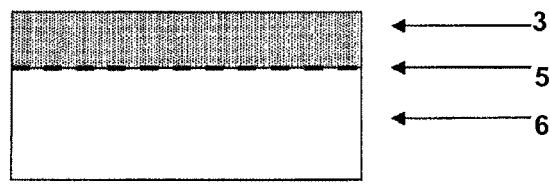

Another alternative optimized two-junction cell is shown in FIG. 3. The two-junction cell in FIG. 3 is comprised of a handle substrate 6 that contains an active silicon subcell. A GaAsP top cell 3 is bonded to the overall structure via a bonded interface 5 that is electrically conductive, thermally conductive, and optically transparent. Thus, this device is slightly different from two previously described in that the handle substrate also contains the bottom cell. In one implementation of this cell, a GaAs or Ge donor film is bonded and transferred to a silicon substrate that contains the active silicon bottom cell. A GaInP or InGaAlP top cell is then epitaxially grown on the donor film. In another implementation, a strain-relaxed InGaAs donor layer is grown on a Ge or a GaAs support substrate (or on a strain engineered virtual substrate) and then transferred to a silicon wafer that contains the active silicon subcell. A lattice-matched or strain-optimized GaInP or InGaAlP top cell is then grown on the transferred InGaAs donor film. This second implementation offers greater flexibility in top cell optimization.

The bandgap of the bottom cell is that of the active Si substrate, and is approximately 1.1 eV. The optimal top cell bandgap depends on the anticipated implementation (e.g. AM0 or AM1.5) but is expected to fall in the range of 1.6 eV and 1.8 eV. The corresponding lattice constant for the top cell InGa(Al)P material falls in the range of 5.6 Å to 5.7 Å.

Figure 4:
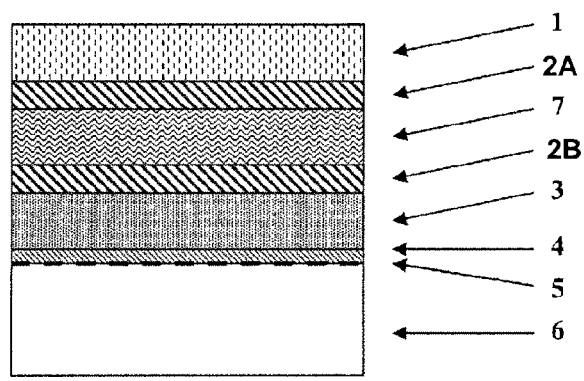

Improved 3-Junction Cell Using Wafer Bonding and Layer Transfer of an InGaAs Thin Film Grown on a Lattice-Matched Substrate Wafer bonding and layer transfer of epitaxial templates could also be used to create 3-junction solar cells. One such implementation is shown in FIG. 4. In this case, three subcells are epitaxially grown on top of a lattice matched epitaxial template or donor film that was transferred from an epitaxial donor substrate. As with previous designs, the epitaxial template is comprised of a material that possesses a lattice constant suitable for the growth of an optimized triple junction cell but is typically not available in bulk form.

FIG. 4 illustrates a 3-junction solar cell comprised of top cell 1, middle cell 7, and bottom cell 3 on a handle substrate 6. The cell is made by wafer bonding and layer transfer of an epitaxial template or donor film 4 onto the handle substrate 6. The bonded interface 5 may be thermally and electrically conductive as well as optically transparent in some implementations. Wafer bonded tunnel junctions 2A, 2B may be used to connect the top and middle cells and middle and bottom cells, respectively.

An example of a design that could effectively leverage this structure to improve upon existing designs would be comprised of the following: an InAlAs top cell 1, an InGaAsP middle cell 7, and an InGaAs bottom cell 3. The handle substrate 6 could be comprised of any of the conventional or alternative substrates mentioned above (e.g., silicon, sapphire, Ge, GaAs, etc.). An InGaAs epitaxial template having a lattice constant of 5.82 Å to 5.84 Å could be used, and the three subcells could be grown substantially lattice-matched to this template. Material bandgaps for this optimized three-junction would fall in the range of 1.7 eV to 1.8 eV, 1.1 eV to 1.2 eV, and 0.6 eV to 0.8 eV for the top, middle, and bottom cells respectively.

An alternative design for a three junction cell incorporates an active subcell into the handle substrate. The structure of such a cell would be similar to FIG. 3, but would include an additional subcell on the top of the structure of FIG. 3, thereby making what is currently labeled the top cell in FIG. 3 into the middle cell. As was mentioned previously, this top subcell could be connected to the middle cell via a tunnel junction. A specific example of such a design would be comprised of the following: an InGaP or InGaAlP top cell, an InGaAs middle cell, and an active-Ge substrate bottom cell.

Both of these structures would enable the manufacture of a triple junction cell using a single monolithic growth process without the need for metamorphic or transitional layer structures that can generate defects and reduce conversion efficiency. In the second example, the bottom cell bandgap is fixed by the active-Ge substrate, and the InGaAs composition would be tuned to match the lattice constant of the optimal middle cell bandgap. As in the case of the optimized 2-junction cell, an optimized composition of InGaAlP can be used for the top cell. In the first example, the lattice constant of the InGaAs template layer is selected such that the combination of the lattice-matched top cell (InAlAs) and bottom cell (InGaAs) bandgaps is optimal. The InGaAsP middle cell composition can be tuned to the optimal bandgap while maintaining lattice match with the template layer. In some implementations, an optimized composition of InAlGaAs can be used for the top cell to allow further design flexibility.

Wafer-Bonded 4- and 5-Junction Solar Cell Designs

In addition to the 2- and 3-junction embodiments described above, wafer bonding and layer transfer techniques can be exploited to realize optimized 4- and 5-junction solar cell designs. Here we describe a specific design using a single wafer bonding step and two epitaxial growth steps, although the techniques described here are envisioned to apply equally to other designs using either single or multiple layer-transfer, bonding and epitaxial growth steps.

In this design, the fifth (bottom) subcell, which is located immediately adjacent the substrate, is comprised of InGaAs, which is approximately lattice-matched to InP. The substrate can consist either of InP, or a virtual substrate consisting for example of an InP or InGaAs donor or template film bonded to silicon, sapphire, or other handle substrate. The fourth and third subcells, which are located sequentially immediately adjacent the fifth subcell, consist of InGaAsP and InP respectively, and are both substantially lattice-matched to the underlying bottom cell. For the fifth, fourth, and third subcells the lattice constant is in the range of 5.85 A to 5.89 A, and the material bandgaps fall in the ranges of 0.6 eV to 0.8 eV, 1.0 eV to 1.2 eV, and 1.34 eV to 1.36 eV respectively. Alternatively, a composition of InGaAsP can be chosen for the fifth cell, to allow greater flexibility in the optimization of the bandgap of this cell.

The first and second subcells consist of InGaP and GaAsP respectively. These two subcells are substantially lattice-matched, and have a lattice constant of 5.56 A to 5.6 A. The corresponding material bandgaps are in the ranges of 2.0 eV to 2.2 eV and 1.6 eV to 1.8 eV for the first and second subcells respectively. In one realization of the design, these two subcells are grown in reverse sequence (first subcell is grown first, followed by the second subcell) on a suitable lattice-matched substrate, consisting for example of Si(x)Ge(1−x) where x is approximately 0.2, or a virtual substrate consisting for example of an InGaP donor layer on a GaAs or silicon handle substrate. Following growth of these top two subcells, a wafer bond is made between the uppermost subcell of this growth (i.e. the second subcell), and the uppermost subcell of the previously described growth (i.e. the third subcell). The substrate used for the first and second subcell growth is then removed, using for example a selective etch or grind and polish step.

In another realization of the design, an epitaxial donor film of InGaP having a lattice constant of 5.56 A to 5.6 A is transferred directly to the top surface of the third subcell. The donor layer for this InGaP donor film can be fabricated in a manner analogous to that described for the manufacture of InGaAs donor layers, and is described in more detail below. The second and first subcells can then be grown sequentially in a single subsequent growth step.

Another 5-junction design consists of the same fifth, fourth and third subcells of the design above, but incorporates an InGaP and AlInP second and first subcell respectively. The top two subcells have the same range of material bandgaps as in the previous example, and can be grown substantially lattice-matched in a single epitaxial growth step, but in this case the lattice constant is in the range of 5.73 A and 5.77 A. As in the previous example, the top two subcells can be grown in reverse order on a lattice-matched virtual substrate, and then the virtual substrate can be removed after bonding of the top two subcell stack to the bottom three subcell stack. In this case an InGaAs donor film can be used to achieve the required lattice constant. Alternatively an InGaAs, InGaP or AlInP donor film can be transferred directly to the top surface of the third subcell, and the top two subcells can then be deposited in a subsequent growth step.

In all of the 5-junction designs described, the bottom cell can be replaced by an active germanium substrate (bandgap=0.67 eV). In these embodiments, an InP, InGaAs or similarly lattice-matched donor film is transferred to the germanium substrate. The fourth and third subcells are deposited onto this template in a single growth step, and the top two subcells are added by wafer bonding or layer transfer and growth as described previously.

4-junction designs can be realized by simply omitting any one of the subcells in the 5-junction designs describe above. Other 4-junction designs that potentially offer simplified manufacturability can also be realized. One example consists of 4 lattice-matched subcells deposited in a single epitaxial growth step on a virtual InGaAs substrate. As in previous examples, one of any number of handle substrates can be used. In this case the epitaxial donor film lattice constant falls in the range of 5.8 A to 5.85 A, and the materials and bandgap ranges of the first (top), second, third and fourth (bottom) subcells are respectively: InAlAs (1.8 eV to 2.0 eV), InGaAlP (1.5 eV to 1.7 eV), InGaAsP (1.1 eV to 1.2 eV) and InGaAs (0.8 to 0.9 eV). Any lattice-matched material can be used for the epitaxial donor layer, including InAlAs and InGaP. Another design consists of any three of the four subcells just described, deposited on an active germanium substrate (bandgap=0.67 eV) which forms the bottom cell. In this case the epitaxial donor layer (InGaAs or another lattice-matched material) is transferred to the Ge substrate to enable the lattice-matched growth of the top three subcells.

Integral Sapphire Cover Glass/Handle Substrate Based Designs

In the assembly of solar cell modules, the cell is generally encapsulated in a cover glass or other protective material structure (such as a polymer or ceramic material) that is transparent to solar radiation to protect the solar module from its surrounding environment, either a terrestrial or space ambient. Preferably, the protective structure comprises a solar radiation transparent plate.

U.S. application Ser. No. 11/255,194, filed on Oct. 21, 2005 and incorporated herein by reference in its entirety, describes how wafer bonding enables multi-junction solar cells to be directly bonded to the cover glass of the solar cell in order to reduce cell mass and cost. The present inventors also realized that wafer bonding and layer transfer also enables the cover glass to be used as the handle substrate during the manufacturing of the device, offering even greater potential manufacturing cost savings. This latter technique is described in more detail below and shown in FIG. 5.

Figure 5:
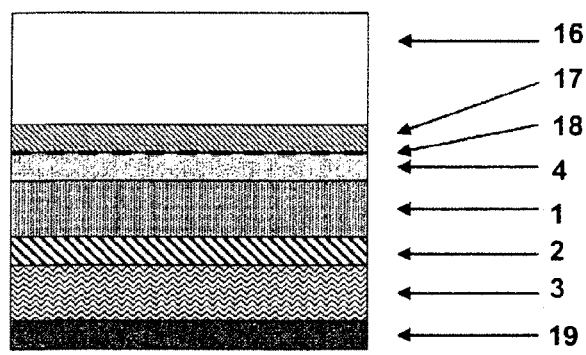

FIG. 5 illustrates a schematic of a 2-junction cell where the handle substrate and coverglass have been combined into a single element 16. A contact layer 17 comprised of a metal contact grid and support matrix that is stable at high temperatures is attached directly to the handle substrate/cover glass. An optional epitaxial template or donor film 4 is shown and is connected to the contact layer 17 via a bonded interface 18. A top cell 1 is epitaxially grown on the donor film 4. Alternatively, when the donor film 4 is not present, the top cell is bonded to the contact layer. A tunnel junction 2 connects the top subcell 1 to the bottom subcell 3. A conductive and, in some cases, optically reflective, layer 19 is deposited on the back surface of the cell.

In this case, the actual cell (or epitaxial donor film) is bonded to a layer that is comprised of the metal contact leads and a bonding material which can be any of a number materials including, but not limited to, spin-on glasses or transparent polymers, which promote bonding and prevents the trapping of gas bubbles between the cover glass and solar cell. The resulting structure is then subjected to the standard monolithic epitaxial growth process that is used to manufacture solar cells.

Note that this design results in an 'upside down' manufacturing process, in which the 'top' cell is now closest to the handle substrate and subsequent layers (and cells) are deposited in reverse order from a standard manufacturing process. The uppermost layer of the full structure is metallized and contacts to the conductive grid on the front of the cell are etched through the substrate that forms the cover glass plate using any of a number of processes.

In this design, the cover glass substrate can be comprised of any of a number of materials including sapphire, glass (such as borosilicate glass) and other suitable, optically transparent materials, selected for their optical transmission, thermal expansion characteristics and/or low mass.

Figure 6:
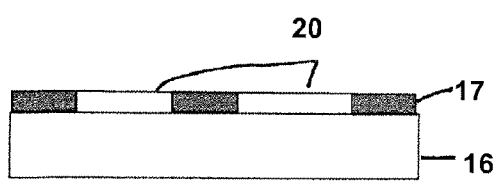

A sample contact/bonding layer is shown in FIG. 6. Specifically, FIG. 6 illustrates the structure of the metal contact grid 17 in a support matrix 20 on the combined cover glass/handle substrate 16.

Figure 7:
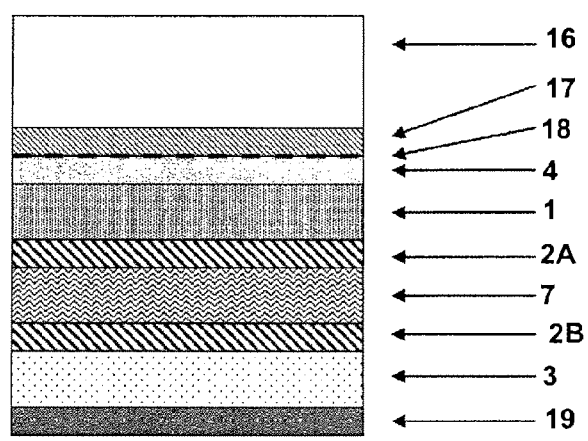

A sample 3-junction device where the handle substrate and coverglass have been combined into a single element 16 is shown in FIG. 7. A contact layer 17 comprised of a metal contact grid and support matrix that is stable at high temperatures is attached directly to the handle substrate/cover glass 16. An optional Ge or GaAs epitaxial template or donor film 4 is connected to the contact layer 17 via a bonded interface 18. A top cell 1 is grown on film 4, or, when film 4 is not present, is bonded to layer 17. A tunnel junction 2A connects the top subcell 1 to the middle subcell 7. An additional tunnel junction 2B connects the middle cell 7 to the bottom cell 3. A conductive and, in some cases, optically reflective, layer 19 is deposited on the back surface of the cell.

One implementation of the integral sapphire coverglass design is a 3-junction cell in which the top, middle and bottom subcells consist of layers of InAlAs, InGaP or InGaAsP, and InGaAs respectively. First a donor substrate consisting of single or multiple layers of InAlAs on a suitable support substrate, such as InP, is fabricated. This structure is similar to the InGaAs donor substrate discussed previously, except in this case the InAlAs composition is selected to match the optimized top cell bandgap. A conductive contact grid is fabricated on the sapphire substrate that will form the integral coverglass. In some cases an antireflection coating material such as $MoSi_2$ may be applied to the substrate bonding surface in order to minimize reflections associated with the refractive index mismatch between the sapphire and the epitaxial donor film. Substrate bonding and layer transfer techniques are then used to transfer an InAlAs donor film from the donor substrate to the sapphire handle substrate. The InAlAs, InGa(As)P and InGaAs subcell layers, and the appropriate tunnel junction layers that form the 3-junction structure, are deposited using a single epitaxial growth in which all layers are lattice-matched or nearly lattice matched to the InAlAs donor film. In this design, the lattice constant for the donor film is in the range of 0.58 nm to 0.59 nm, and the material bandgaps of the lattice-matched subcell layers are in the range of 1.7 eV to 1.9 eV, 1.1 eV to 1.3 eV, and 0.7 eV to 0.9 eV for the InAlAs, InGa(As)P, and InGaAs layers respectively.

Wafer Bonding-Enabled Independently-Connected Multi-Junction Solar Cells

In all of the series-connected designs discussed above, the solar cell optimization is constrained by the requirement that all of the subcells be current-matched. This constraint can be relaxed if each of the subcells or if groups of subcells (i.e., at least two subcells), are independently electrically connected. It is envisioned that while realization of a completely independently connected multi-junction solar cell could be very costly, independent connections for groups of subcells could be enabled by wafer bonding techniques, and could be cost-effective if used at steps where wafer bonding is already employed. In the case of the 5-junction cell designs described above for example, a wafer bonding-enabled independent connection could be implemented between the second and third subcells, so that the top two subcells and the bottom three subcells form two independently connected subcell groups.

Figure 29:
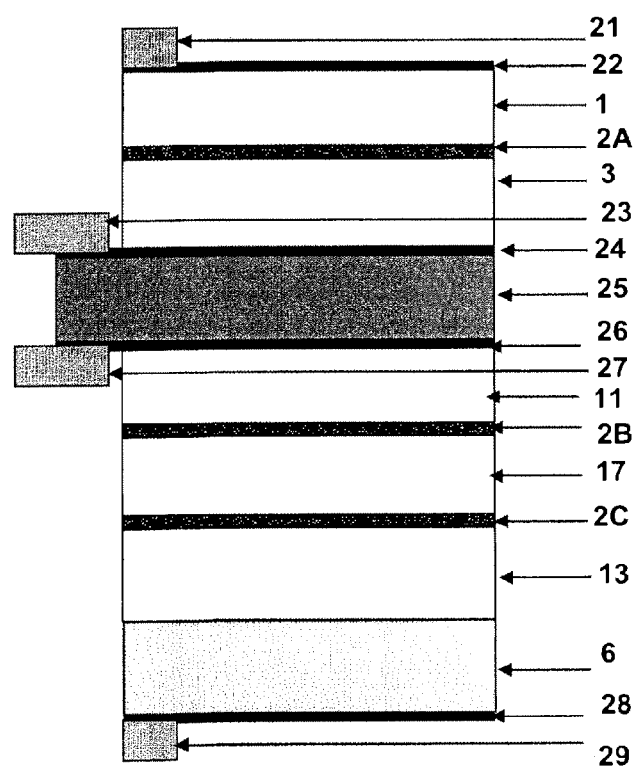

Here a 5-junction cell is described although the method applies equally to solar cells having any number of subcells. This embodiment is shown in FIG. 29, in which a 5-junction solar cell has four independent contacts. In the solar cell of FIG. 29, 21 is a top contact tab, 22 is a top cell contact metallization grid, 1 is the first subcell, 2A is a first tunnel junction, 3 is a second subcell, 23 is an upper subcell group contact tab, 24 is an upper subcell group contact grid, 25 is an insulating spacer, 26 is a lower subcell group contact grid, 27 is a lower subcell group contact tab, 11 is a third subcell, 2B is a second tunnel junction, 17 is a fourth subcell, 2C is a third tunnel junction, 13 is a fifth subcell, 6 is a substrate, such as a handle or other substrate, 28 is a bottom cell contact metallization and 29 is a bottom contact tab. The device may also contain an optional donor film 4 if any of the cells are epitaxially grown on the film 4.

In the device of FIG. 29, the top two subcells 1, 3 and the bottom three subcells 11, 13 and 17 are independently connected. An electrically insulating spacer 25 is inserted between the second 3 and third 11 subcells. This spacer can be comprised of borosilicate glass, pyrex, sodalime glass, sapphire, spin-on-glass, or any of a number of materials chosen for their optical transparency, thermal properties, refractive index, electrical insulation, and cost. Ideally the spacer has a refractive index and thermal expansion coefficient that closely matches those of the adjacent semiconductor layers. Although the thickness of the spacer will be determined by performance and manufacturability criteria for each application, it is envisioned that it will fall in the range of 0.05 mm to 5 mm.

Metal contact grids are formed on the top and bottom surfaces of the insulating spacer. These grids can be formed using standard glass patterning and metallization techniques. The grid geometry can be optimized for the particular application but generally consists of an array of metallized parallel lines that can be connected with an intersecting perpendicular metallized line at either or both ends of the parallel array. The contact grids may also have a different configuration from parallel lines. If desired, the contacts may comprise continuous layers rather than grids. The metal grids are connected to contact pads at the edges of the spacer. Antireflection coatings can also be applied to the surfaces of the spacer. The upper two subcells and the bottom three subcells are bonded to opposing sides of the spacer, such that the contact pads (as well as preferably, but not necessarily, the spacer) protrude out from the bonded structure. Electrical contact can then be made to the two subcell groups via the contact pads on either surface of the spacer, and metallization layers applied to the top and bottom surfaces of the solar cell. Typically metal contact tabs are attached to the contact surfaces by soldering in order to facilitate wiring of the cells.

Figure 30:
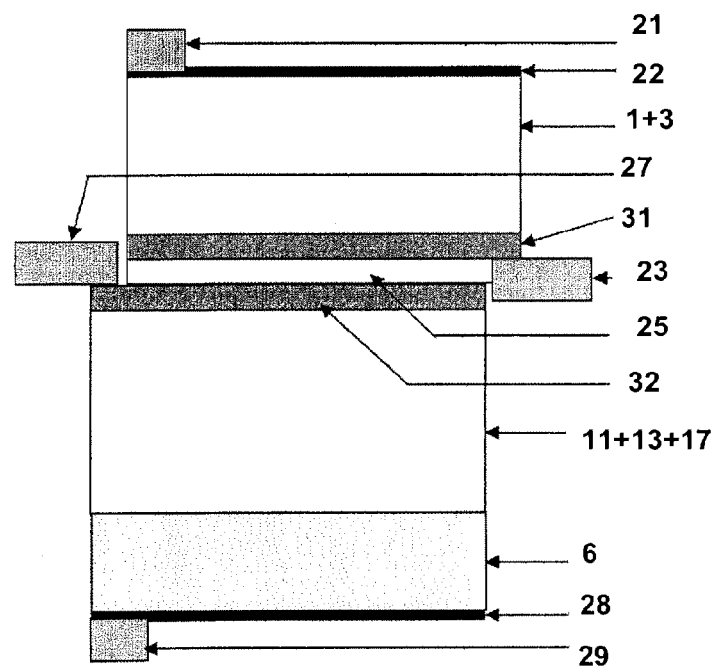

Alternative implementations include those in which the metal grids on the spacer are omitted, and current spreading layers are used to facilitate electrical contact. Such an implementation is shown in FIG. 30, in which a multijunction solar cell with 4 independent contacts contains current spreading and insulating layers. In FIG. 30, 21 is a top contact tab, 22 is a top contact grid, 1+3 is an upper subcell group, 31 is a current spreading layer for bottom contact of upper subcell group, 23 is the bottom contact tab for upper subcell group, 25 is the insulating spacer layer, 27 is a top contact tab for lower subcell group, 32 is a current spreading layer for top contact of lower subcell group, 11+13+17 is a lower subcell group, 6 is a substrate, 28 is a bottom contact layer and 29 is a bottom contact tab. It should be noted that the donor film 4 may also be used in this device. Furthermore, in the design shown in FIG. 30, the insulating spacer 25 does not protrude from the stacked cells. Thus, in FIG. 29, the protruding spacer forms two offset regions containing the contact tabs. In FIG. 30, at least two subcells are offset from each other to form the two offset regions containing the contact tabs.

These current spreading layers could consist of highly doped epitaxial layers deposited on the subcell layers, optically thin metal silicide layers, or any other combination of conductive layers designed to minimize light absorption. Physical access to these current spreading layers to permit electrical connections could be achieved for example by offset bonding, in which a small portion of the subcell bonding surface protrudes beyond the edge of the adjacent spacer bonding surface. Such a scheme is shown in FIG. 30. It is envisioned that the offset distance is between 0.05 mm and 5 mm. In another implementation the insulating spacer is replaced by an epitaxially grown semi-insulating layer having a bandgap greater than or equal to that of the third subcell, for example Fe-doped InP. In this case it is envisioned that the epitaxially grown spacer thickness will be in the range of 0.05 microns to 5 microns, and electrical access to the contact layer is achieved by selective chemical etching of the spacer layer in the region at which electrical contact is to be made.

Manufacturing Process

The process used to create and transfer the donor film may be used for all support substrate materials.

Step 1

The first step includes growth of single or multiple thin films of material on a lattice matched substrate, lattice-mismatched substrate, or lattice matched virtual substrate to form the epitaxial donor structure.

Figure 8A:
Figure 8B:
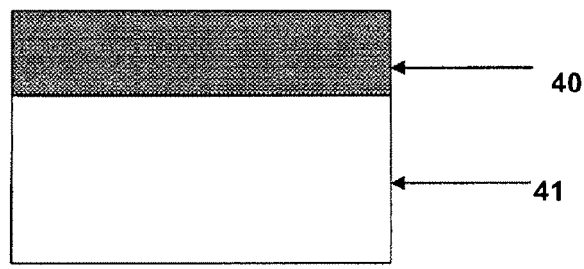

The process begins with the growth of an epitaxial donor layer on a support substrate, as shown in FIGS. 8A and 8B. FIG. 8A shows the support substrate 41 prior to processing.

FIG. 8B shows the epitaxial growth of the epitaxial donor layer 40 on the support substrate 41. Note that the epitaxial donor layer thickness may be selected to be much thicker than an individual epitaxial donor film that is to be transferred in order to allow multiple films to be transferred from a single epitaxial donor substrate. The epitaxial donor layer may also include metamorphic layers and graded transitional layers in cases where the epitaxial donor layer is not lattice matched to the support substrate.

The support substrate may be lattice matched to the epitaxial donor layer. Alternatively, the epitaxial donor layer may also be grown on non-lattice matched substrates using a metamorphic or transitional layer process. In this latter case, the epitaxial donor layer will be grown to a thickness sufficient to achieve material quality suitable for high efficiency solar cells. In some cases, multiple layers or a very thick layer capable of transferring multiple films will be grown.

The support substrate 41 may comprise a bulk crystalline semiconductor wafer or a virtual substrate. The lattice constant of the support substrate is selected to match (or nearly match) the lattice constant of the epitaxial donor layer 40. In some cases, the lattice constant of the epitaxial support substrate may be selected to optimize the growth and resulting material quality of the epitaxial donor layer.

In the case where a thin film of InGaAs or related compound described above is to be grown, a Ge or GaAs bulk support substrate may be used. Note that because the InGaAs is not lattice matched to the support substrate, a metamorphic or compositionally-graded transitional layer process may be used. In these cases, the thickness of the grown InGaAs film will be selected to ensure that the quality of the material in the film is sufficient for use in high efficiency multi-junction solar cells.

In some implementations where a metamorphic growth process is used, and where surface roughness is generated during this process, an alternative process can be used. In this process, the film resulting from the initial metamorphic growth is subjected to a surface smoothing treatment such as a chemical mechanical polish. A layer of the resulting low-roughness, unstrained film is then transferred to a second support substrate having desirable thermal properties. In the case of an InGaAs donor film, GaAs or Ge would be suitable support substrates. The layer transfer can be effected either by use of suitable etch stop layers in the original donor substrate or using the implantation technique described below. The transferred film now serves as an epitaxial template for further growth of the donor film material. The donor material is deposited by an epitaxial growth process, and may include various combinations of etch stops, damage removal layers, and separation layers as described in more detail below. Note that the deposition of the donor layer can be performed without strain relaxation since now the epitaxial template matches the desired lattice constant. This combination of support substrate and deposited donor material layers serves as the epitaxial donor substrate or structure. In some implementations, the thickness of the layer(s) can be selected to control the thickness of the device film(s) that is to be transferred onto the support substrate.

Figure 9:
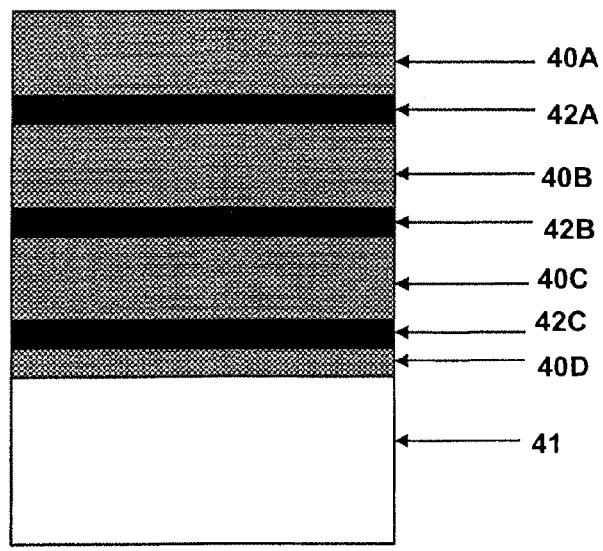

In some implementations, a lattice matched etch stop layer (or multiple etch stop layers in the case where multiple films will be transferred from a single epitaxial donor structure) may be used, as shown in FIG. 9. FIG. 9 illustrates the growth of one or more epitaxial donor layers 40A-D and etch stop layers 42A-C on the support substrate 41. Each etch stop layer 42 is located between two donor layers 40 or between the substrate 41 and a donor layer 40. Note that a donor layer 40D may be grown on the substrate 41 prior to the growth of the first etch stop layer in some implementations.

The purpose of the etch stop layer is to enable the use of a material selective etch process on both the transferred epitaxial donor layer and donor structure. Thus, the etch stop layer comprises a material which can be selectively or preferentially etched compared to the donor layer with a first etching medium. The donor layer material may comprise a material which can be selectively or preferentially etched compared to the etch stop layer with a different second etching medium. Thus, the composition of the etch stop layer depends on the composition of the donor layer and may comprise any suitable known etch stop layer material for the particular donor layer.

When such a material selective etch process is used on the transferred epitaxial donor layer, it simplifies the removal the damaged layer and creation of an abrupt, well-defined layer of material. When such a process is used on what remains of the epitaxial donor structure after layer transfer, it simplifies the removal of damaged material and preparation of the epitaxial donor structure for subsequent layer transfers. More detail on both of these previously mentioned process steps is provided below.

Sample techniques for GaAs and related epitaxial donor layers grown on Ge epitaxial support substrates are given below. Growth of a thin InGaP structure at or near the bottom of the GaAs on a Ge substrate would allow selective removal of the InGaP with $NH_4OH:H_2O_2:H_2O$ following bonding to leave a smooth, abrupt GaAs surface. Growth of a thin AlGaAs structure near the bottom of a GaAs on Ge substrate could also form a smooth, abrupt etch stop layer that can be selectively removed with a citric-acid:$H_2O_2$ solution.

Figure 10:
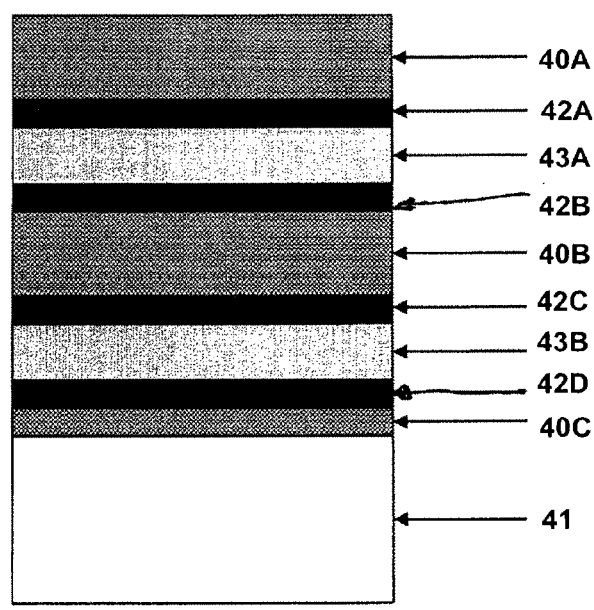

Using a lattice matched 'sacrificial' layer can further improve control of the thickness and resulting smoothness of the transferred layer, as shown in FIG. 10. In addition, such a layer could also increase the yield and improve the economics of the transfer process.

FIG. 10 illustrates growth of the epitaxial donor layers 40A-C, etch stop layers 42A-D, and sacrificial layers 43A-B on the support substrate 41. Note that a thin donor layer 40C may be grown prior to the growth of the first etch stop layer 42D in some implementations. Note also that a single layer may play the role of both the etch stop and sacrificial layers.

The sacrificial layer takes the form of a thin layer of material that possesses properties that are more favorable to crack propagation and/or collection of implanted ions than surrounding layers. A partial listing of properties that could be altered includes the stress state of the film, the bulk modulus, the CTE mismatch with the donor substrate.

By engineering the implant energy such that the peak (or peaks) of the concentration of implanted ions occurs in this sacrificial layer, it is possible to use the sacrificial layer's higher propensity to crack formation to control the crack propagation process and limit crack propagation to the sacrificial layer. This superior control can improve the economics of the layer transfer process by reducing the required dose of implanted ions necessary for effective layer transfer and also positively impacting yield.

The materials properties of the sacrificial layer could also be selected (along with other variables in the wafer bonding and layer transfer process) to engineer the temperature at which separation of the epitaxial donor layer from the remainder of the epitaxial donor substrate occurs. Such control would allow for higher bonding temperatures than could be obtained without the optimization of such a layer, thereby enabling bonding temperature to be used to control the strain of the epitaxial donor film in the final bonded structure.

In the case where a GaAs thin film or related compound (e.g., GaInP, AlGaAs, InGaAs) is to be transferred from a GaAs or Ge bulk wafer (that may include metamorphic or transitional layers), a thin layer of strained InGaP or GaAsP can act as an effective sacrificial layer. The thickness of the sacrificial layer and its positioning relative to the donor layer is optimized with respect to the experimentally determined implantation profile for the material, implantation species, implantation energy, and implantation dose. In some implementations, a single film may play the role of an etch stop layer and sacrificial layer.

A protective layer that is deposited on the top surface of the epitaxial donor substrate prior to implantation may also be used. In some implementations, this protective layer may be grown into the epitaxial donor structure so that it lies on the top surface during subsequent implantations may also be used. The purpose of this layer is to protect the surface of the epitaxial donor films from contamination and sputter effects during the implantation process. In some implementations, a single layer may play the role of the protective layer and the sacrificial or etch stop layers.

Step 2

Step 2 includes implantation of the epitaxial donor substrate with an optimized dose and energy combination of $H^+$, $He^+$, $H^+/He^+$, or other ions.

Once the epitaxial donor structure is prepared, it is implanted with an optimized dose and energy combination of $H^+$, $He^+$, $H^+/He^+$, or other ions in order to enable layer transfer in a subsequent manufacturing step. The implanted ions create a layer in the epitaxial donor structure that is rich in implanted ions. In some cases, a thermal and pressure treatment cycle may be required to create the previously mentioned ion-rich layer. In subsequent steps, with appropriate treatment, this ion-rich layer can be made to split, thereby enabling the transfer of the epitaxial donor film from the epitaxial donor structure onto the handle substrate. The ion-rich layer will be termed the damaged layer or the damaged region herein after. The depth of the ion implantation that is selected differs depending on the structure of the epitaxial donor structure.

Case I

Figure 11:
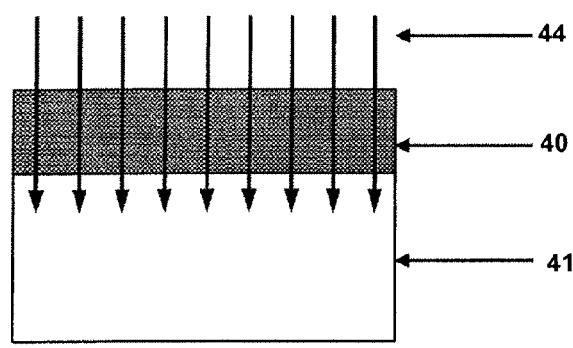
Figure 12:
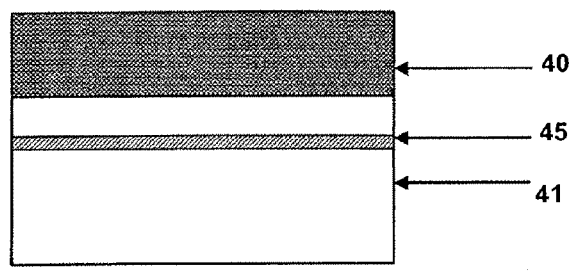

In cases where the epitaxial donor structure is comprised of a single layer of donor material grown on a bulk substrate, the implant energy will be selected to ensure that the damaged region of the implantation occurs primarily in the support substrate, away from the interface between the support substrate and the epitaxial donor layer, as shown in FIGS. 11 and 12. FIG. 11 shown the implantation of the epitaxial donor substrate with ions 44. Implanting ions 44 travel through the donor layer 40 and are stopped in the support substrate 41. FIG. 12 illustrates the epitaxial donor substrate containing the damaged region 45 created by the implantation in the support substrate 41.

Case II

Figure 13:
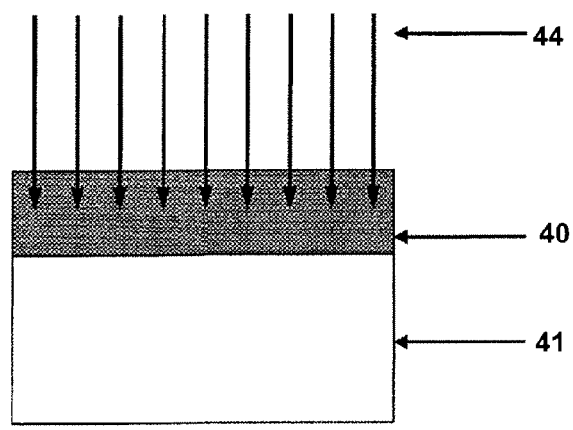
Figure 14:
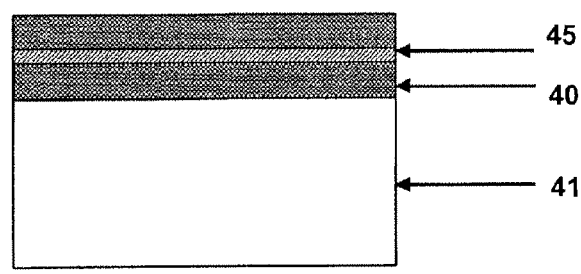

In cases where the epitaxial donor structure is comprised of a thick epitaxial donor layer that will be used to transfer multiple epitaxial donor films, the implant energy will be selected to ensure that the damaged region resulting from the implantation occurs primarily in epitaxial donor material, as shown in FIGS. 13 and 14. FIG. 13 illustrates implantation of the epitaxial donor substrate with ions 44. The ions 44 are stopped in the donor layer 40 rather than in the support substrate 41. FIG. 14 shows the epitaxial donor substrate with the damaged region 45 located in the donor layer 40.

Case III

Figure 15:
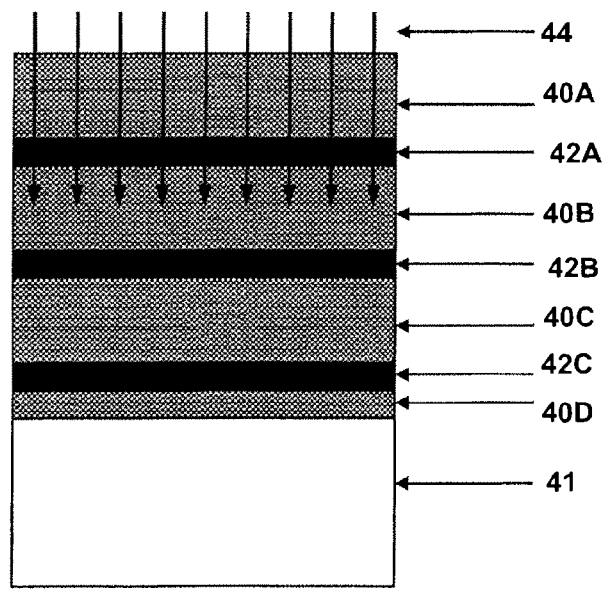
Figure 16:
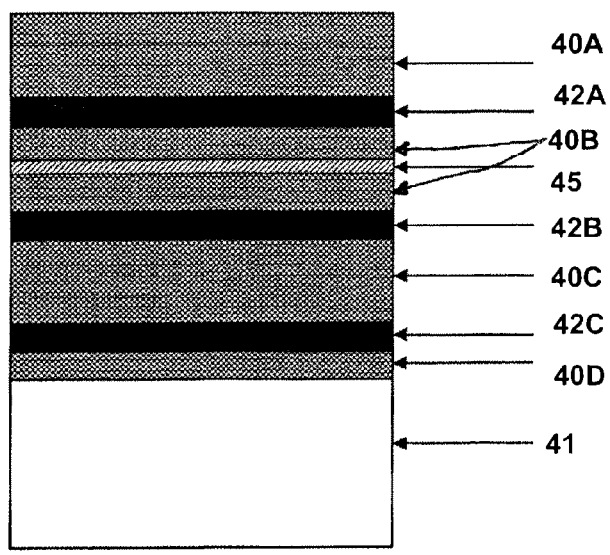

In cases where the epitaxial donor structure is comprised of one or many epitaxial donor layers and etch stop layers, the implant energy will be selected to ensure that the damaged region resulting from the implantation occurs primarily in either a layer of epitaxial donor material that lies below an etch stop layer or in the etch stop layer. FIG. 15 shows the implantation of the epitaxial donor substrate with ions 44. The ions 44 travel through the top donor layer 40A and etch stop layer 42A and are stopped in the underlying donor layer 40B. FIG. 16 shows the damaged region 45 located in the donor layer 40B.

Case IV

Figure 17:
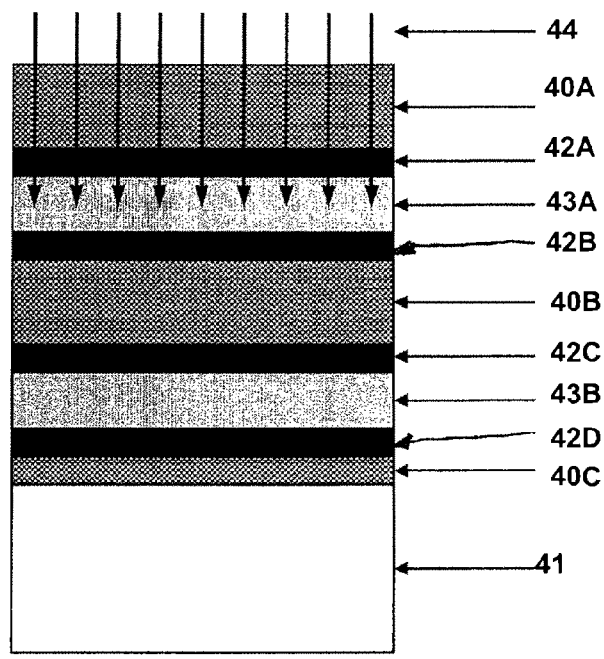
Figure 18:
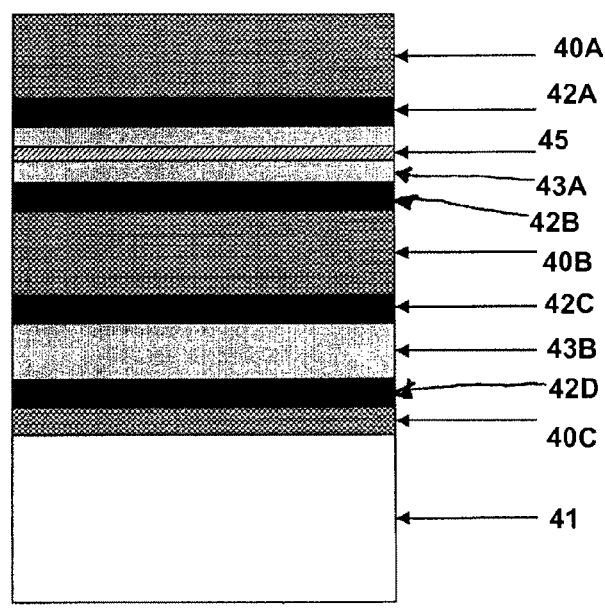

In cases where a sacrificial layer is used, the implant energy will be selected to ensure that the damaged region of the implantation occurs predominantly in the sacrificial layer rather than in the epitaxial donor material, as shown in FIGS. 17 and 18. FIG. 17 shows the implantation of the epitaxial donor substrate with ions 44. The ions 44 are stopped within the sacrificial layer 43A. FIG. 18 shows the damaged region 45 located in the sacrificial layer 43A.

In cases where a combined etch stop/sacrificial layer is used, the implant energy will be selected to ensure that the damaged region of the implantation occurs predominantly in this combined function layer.

For example, in implementations where the epitaxial donor substrate is comprised of a GaAs or related epitaxial donor layer grown atop a Ge or GaAs substrate, the implant energy will be selected so that damaged region occurs either in 1) the epitaxial support substrate away from the epitaxial donor layer/epitaxial support substrate interface, or 2) in the epitaxial donor layer, away from the interface between the epitaxial donor layer and epitaxial support substrate. Note that the dose at a given energy can be optimized as a function of substrate temperature during implant.

Step 3

Step 3 includes a wet and/or dry chemical passivation processes to activate the surfaces of both the epitaxial donor substrate and the handle substrate.

Wet and/or dry chemical passivation processes can be employed to activate the surfaces of both the epitaxial donor substrate and the handle substrate. Note that the handle substrate can be any substrate or surface that will be used to support the epitaxial donor film during operation or subsequent manufacturing processes. In cases where a protective layer has been used, it will be removed prior to chemical passivation.

Hydrophobic surface passivation can be utilized to arrive at an abrupt, electrically-conducting bonded interface. For example, the hydrophobic passivation may include: 1) dilute HF is a good hydrophobically passivating etch for Si; 2) HCl is reported to hydrophobically passivate GaAs and would be expected to work for the extended family of GaAs based ternaries and quaternaries; 3) other wet chemical etches that leave a predominantly H-passivated surface might also be employed; 4) dry chemical etching with an inert atmosphere that sputters away oxidized surface material may be used to render the surfaces hydrophobic; 5) dry chemical etching with a reactive gas such as a hydrogen plasma might also chemically remove oxides from both the Si and GaAs substrates; and/or 6) other plasma passivation methods may also be used.

Hydrophilic passivation can be utilized to arrive at a strongly bonded substrate that consists of an electrically isolated epitaxial donor film and handle substrate. In the case where a GaAs or related film is transferred onto a Si substrate, the following surface treatments can be beneficial: 1) $NH_4OH:H_2O_2:H_2O$ solutions are well known to produce a chemical oxide on Si; 2) $H_2SO_4:H_2O_2$ etches produce an oxide on GaAs; 3) ultra-violet ozone treatment of both GaAs and Si can be utilized to produce a thin surface oxide with little or no roughening of the surface; and/or 4) dry etch plasma processes in oxygen plasmas produce chemically activated surface oxides for both Si and GaAs.

Step 4

Step 4 includes bond initiation. Bonding is initiated between the two substrates at a temperature selected to engineer the strain state of the transferred epitaxial donor film at the growth temperature, operating temperature, and temperatures used in subsequent manufacturing processes. In some implementations, the strain in the transferred epitaxial donor layer will be engineered to exactly lattice match materials that will be deposited in later manufacturing steps.

Step 5

Figure 19:
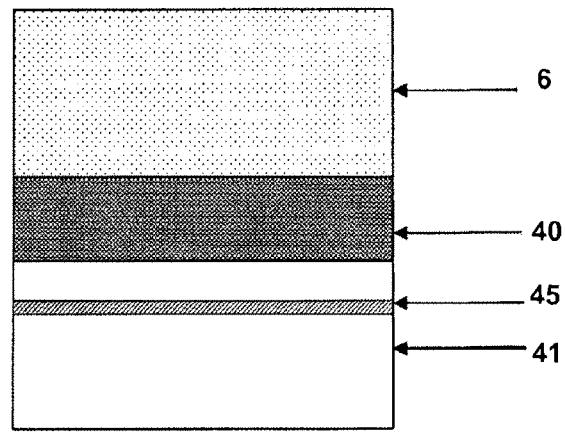
Figure 20:
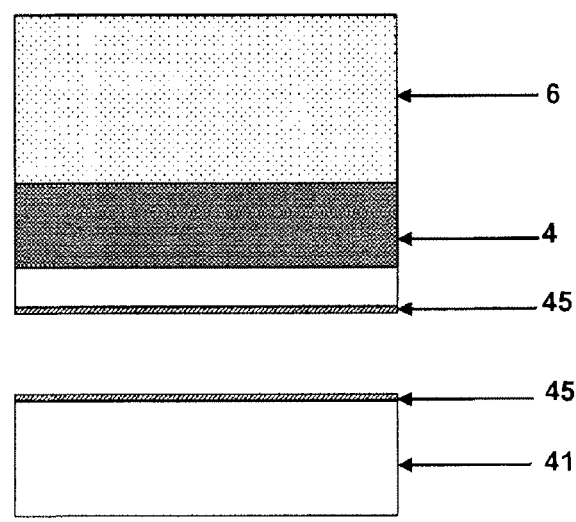
Figure 21:
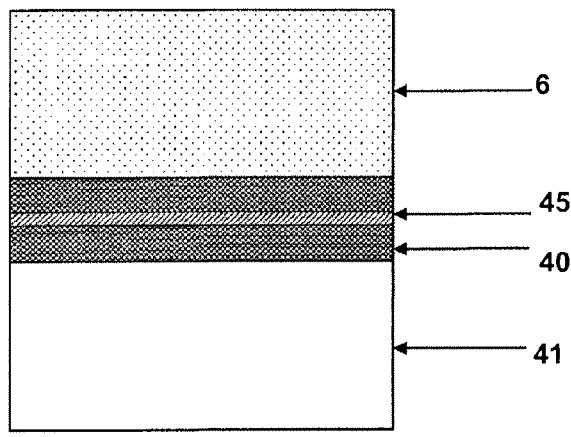

Step 5 includes transfer of the epitaxial donor film to the handle substrate. Application of a pressure-temperature cycle will initiate the transfer of the epitaxial donor film from remainder of the epitaxial donor structure onto the handle substrate as is shown in FIGS. 19-26 for each of the previous four cases mentioned in Step 2. Specifically, for Case I, this is shown in FIGS. 19 and 20, for Case II, in FIGS. 21 and 22, for Case III, in FIGS. 23 and 24, and for Case IV, in FIGS. 25 and 26. These Figures show the bonding of the epitaxial donor structure or substrate to the handle substrate 6 followed by the transfer of the donor film 4 from the donor structure or substrate to the handle substrate 6. The remaining donor structure is separated from the virtual substrate containing the handle substrate 6 and the donor film 4 along the damaged region 45.

Figure 24:
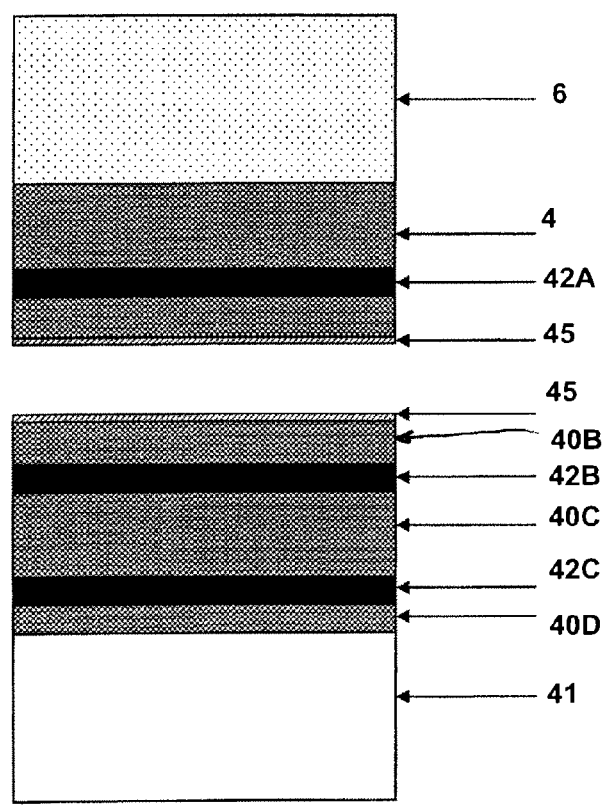
Figure 25:
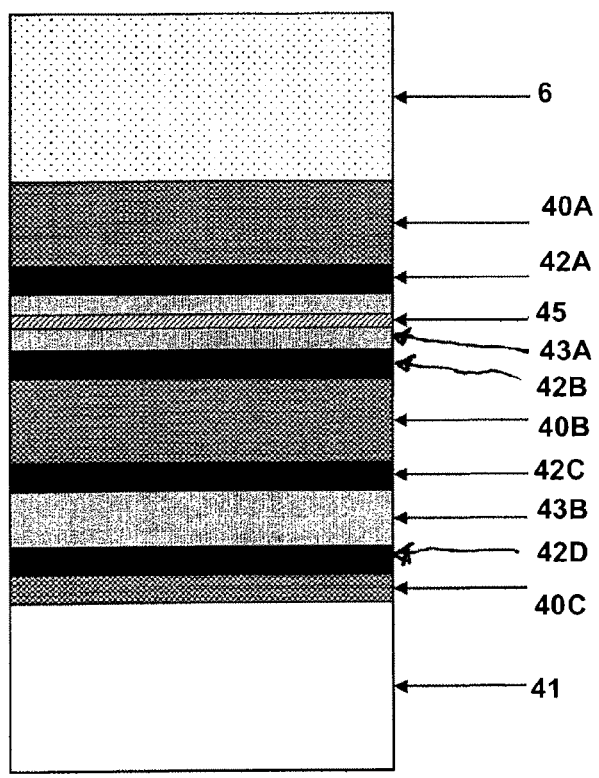
Figure 26:
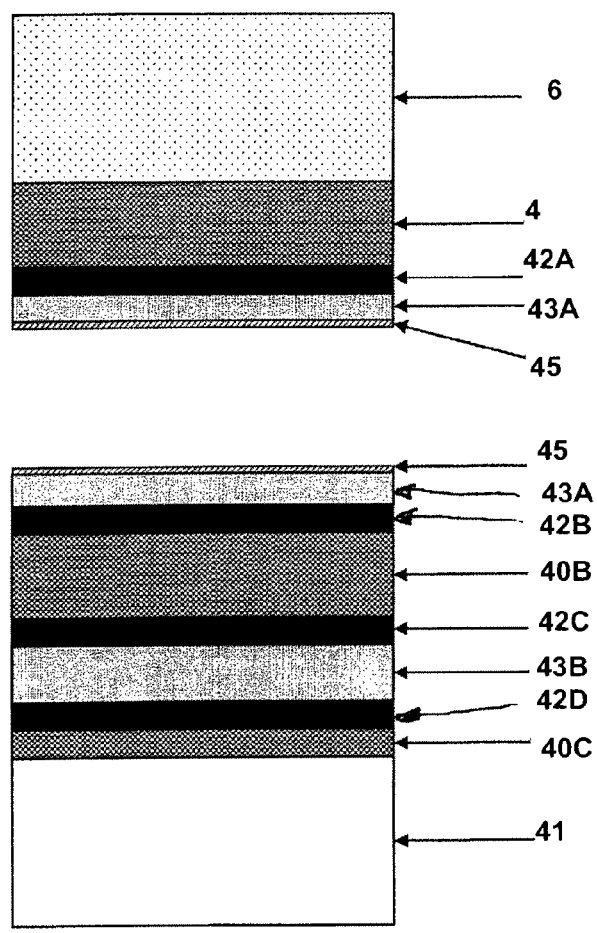

Examples of pressure-temperature cycles include annealing under an optimized temperature-pressure cycle, annealing under constant pressure with constant temperature and/or annealing without the application of pressure. Note that mechanical force may also be used to induce the separation of the epitaxial donor film from the remainder of the epitaxial donor substrate. As shown in FIGS. 20, 24 and 26, respectively, a portion of the support substrate 41, the etch stop layer 42 and/or the sacrificial layer 43 is also transferred to the handle substrate 6. These will be removed in a subsequent process step.

Step 6

Step 6 includes removal of damaged region from transferred epitaxial donor films and preparation of same for subsequent processing steps. Once the epitaxial donor film has been transferred, the damaged region and, in some cases, the sacrificial and etch stop layers are removed. The process for doing so depends upon the type of epitaxial donor structure that was used as well as the location of the damaged region.

For Case I, where the transferred layer consists of a thin donor film of the epitaxial donor material along with a damaged region of the support substrate, as shown in FIG. 20, a chemical mechanical polishing or chemical polishing can be used to remove the damaged transferred portion of the support substrate, thereby creating a smooth surface on the transferred device film suitable for future epitaxial growth.

In the specific implementation of Case I where 1) the epitaxial donor film consists of GaAs or a related arsenide material (e.g., InGaAs), 2) the support substrate is Ge or GaAs, and 3) the damaged region lies in the support substrate, a material selective chemical mechanical polishing or chemical polishing can be used to remove the Ge film from the GaAs film leaving a thin, single-crystal GaAs film bonded to the handle substrate. The literature reports that modest etch rates can be achieved for germanium using a 30% $H_2O_2$:$H_2O$ etch composition. This etch forms a stable oxide in GaAs that prevents further etching. This can be used to remove the residual Ge from the GaAs device film. As described above, further refinement of the device layer thickness can be performed by building in an etch stop structure using AlGaAs or GaInP.

Figure 22:
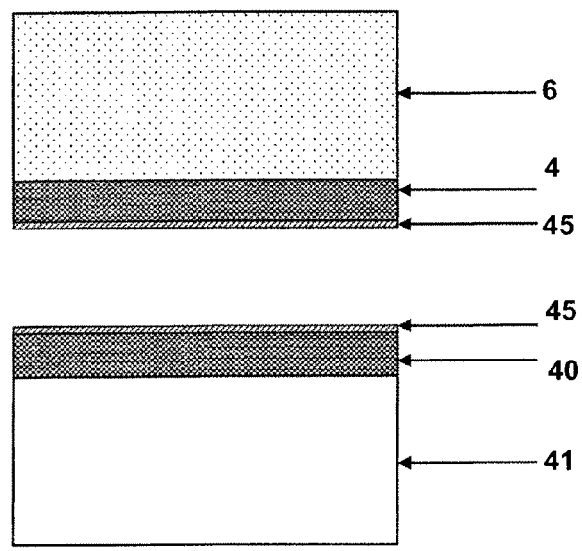
Figure 23:
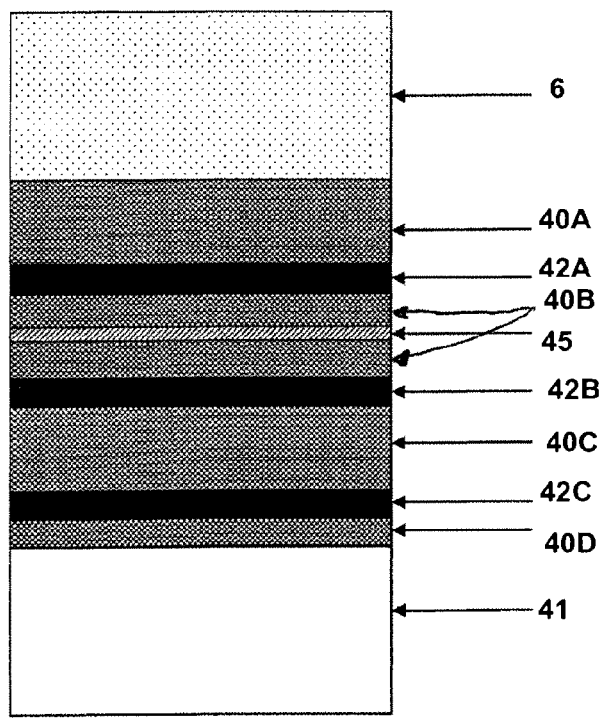

For Case II, where the transferred layer consists of the epitaxial donor film along with a damaged region of the epitaxial donor film, as shown in FIG. 22, a chemical mechanical polishing or chemical polishing can be used to removed the damaged portion of the film and create a smooth surface on the transferred device film suitable for future epitaxial growth.

For Case III, where the transferred layer consists of an epitaxial donor film 4, an etch stop layer 42A, a portion of another epitaxial donor film 40B, and a damaged region 45 of the epitaxial donor film 40B, as shown in FIG. 24, a material-selective chemical etch or chemical-mechanical polish can be used to remove the damaged portion 45 of the film 40B as well as the partial epitaxial donor film 40B up to the etch stop material 42A. Then, in a subsequent step, a different material-selective chemical etch can be used to remove the etch stop layer 42A stopping on film 4. The selective nature of this etch greatly simplifies the removal process and makes possible the creation of a smooth surface on the transferred device film for future epitaxial growth.

For case IV, where the transferred layer consists of an epitaxial donor film 4, an etch stop layer 42A, and a portion of the sacrificial layer 43A that includes a damaged region 45, as shown in FIG. 26, a material selective chemical etching process or chemical-mechanical polishing process can be used to selectively remove both the sacrificial layer 43A and the etch stop layer 42A, either with the same or multiple material selective processes. As was mentioned above, the use of an etch stop layer that is comprised of a material different than the epitaxial donor material enables a material selective etch to be used and mitigates issues associated with removal uniformity. After both the sacrificial and etch stop materials have been removed, the surface of the transferred device film 4 is smooth and suitable for future epitaxial growth.

Step 6

Step 6 includes a reclaim of epitaxial donor structures where appropriate. In some implementations, multiple epitaxial donor layers will be transferred from a single epitaxial donor substrate. In these implementations, damage is removed from the surface of the epitaxial donor substrate prior to reuse.

Case I

After the layer transfer process, the remaining portion of the epitaxial donor substrate is comprised of the bulk of the support substrate 41 and a relatively thin damaged portion 45 (bottom schematic in FIG. 20). Where the cost of the substrate 41 is high relative to the price of reclaiming the substrate, it is desirable to re-use the substrate so that it can act as an epitaxial support substrate in future epitaxial film growths and subsequent layer transfers. Thus, additional epitaxial donor layers 40 are formed on the support substrate 41 and the above process is repeated.

Case II

When the damaged region occurs in the epitaxial donor layer portion of the epitaxial donor structure, the transfer process leaves a thin damaged region on top of an undamaged epitaxial donor layer on the support substrate. Where the cost of fabricating the epitaxial donor substrate is high relative to the price of reclaiming the substrate, it is desirable to re-use the substrate to transfer additional epitaxial donor films. This 'reclaim' can be accomplished using standard chemical mechanical polishing, chemical etching, and/or chemical mechanical etching. The objective is to create a surface that is ready for additional implantation, bonding, and layer transfer steps. Thus, the same or different epitaxial donor layer on the support substrate is used to generate additional donor films on the handle substrate.

Case III

Figure 27:
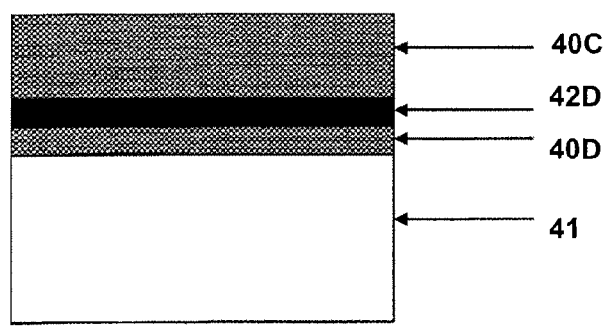

When the epitaxial donor structure is comprised of one or multiple etch stop layers and the damaged region occurs in the epitaxial donor film below an etch stop layer, the post layer transfer structure will be similar to what is shown in the bottom schematic in FIG. 24.

Where the cost of fabricating the epitaxial donor substrate is high relative to the price of reclaiming the substrate, it is desirable to re-use the substrate to transfer additional epitaxial donor films. This 'reclaim' can be accomplished using standard material selective chemical mechanical polishing and/or chemical etching processes. A representative process includes a material selective etch that removes the damaged and undamaged epitaxial donor material followed by a subsequent material selective etch to remove the etch stop layer, resulting in a clean surface exposing the next epitaxial donor layer 40C that can be re-used in the implantation, bonding, and layer transfer process as is shown schematically in FIG. 27.

Case IV

Figure 28:
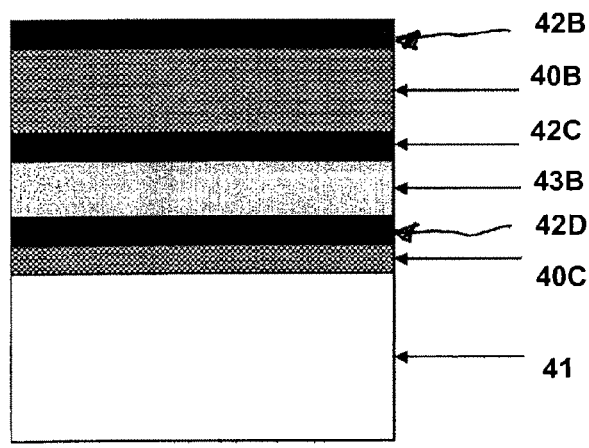

When the epitaxial donor structure is comprised of one or multiple etch stop layers, one or multiple sacrificial layers, and the damaged region occurs in the sacrificial layer below an etch stop layer and the epitaxial donor film to be transferred, the post layer transfer structure will be similar to what is shown in the bottom schematic in FIG. 26.

Where the cost of fabricating the epitaxial donor substrate is high relative to the price of reclaiming the substrate, it is desirable to re-use the substrate to transfer additional epitaxial donor films. This can be accomplished using standard material selective chemical mechanical polishing and/or chemical etching processes. A representative process includes a material selective etch that removes the damaged and undamaged sacrificial layer that was implanted, followed by a subsequent material selective etch to remove the etch stop layer, resulting in a clean surface the next epitaxial donor layer 40B that can be re-used in the implantation, bonding, and layer transfer process. The resulting structure is shown in FIG. 28.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents. All patent applications mentioned herein are incorporated by reference in their entirety. Specifically, the following U.S. application Ser. Nos. 10/233,125, 10/761,918 and 10/784,586, filed on Apr. 17, 2002, Jan. 20, 2004 and Feb. 23, 2004, respectively, and U.S. Provisional Application Ser. Nos. 60/564,251 and 60/526,332 filed Apr. 21, 2004 and Dec. 2, 2003, respectively, are all incorporated herein by reference in their entirety.

What is claimed is:

1. A monolithic multi-junction solar cell device comprising:
   a handle substrate;
   a plurality of cells, deposited on a donor film bonded to the handle substrate, forming a stack, comprising an InGaAs cell, formed on the donor film, and at least one cell selected from a group consisting of: an InP cell and an InGaAsP cell, wherein a wafer-bonded tunnel junction is formed between adjacent ones of the plurality of cells;
   a first contact layer deposited on the stack, wherein a first offset region is formed on a portion of the first contact layer protruding from the stack;
   an insulating spacer layer deposited on the first contact layer;
   a first contact tab and a second contact tab electrically connecting the plurality of cells within the stack, wherein the first contact tab, positioned on the first offset region, is electrically connected to a topmost cell of the stack and the second contact tab is electrically connected to the InGaAs cell formed on the donor film;
   a second contact layer deposited on the insulating spacer layer, the second contact layer protruding from the stack forming a second offset region, and
   a plurality of second cells deposited on said second contact layer, the plurality of second cells selected from a group consisting of: a first group comprising an InGaP cell on a GaAsP cell, and a second group comprising an AlInP cell on an InGaP cell, and
   said second offset region contacting a third contact tab electrically connected to the plurality of second cells.

2. The multi-junction solar cell device of claim 1, wherein an interface bonding the donor film to the handle substrate is conductive.

3. The multi-junction solar cell device of claim 1, wherein the donor film is a transfer film.

4. A multi-junction solar cell device comprising:
   a handle substrate;
   a plurality of cells comprising: an InGaAs cell bonded to the handle substrate, and at least one of: an InP cell; and an InGaAsP cell, wherein a wafer-bonded tunnel junction is formed between adjacent ones of said plurality of cells;
   a first contact tab electrically connected to a first one of said plurality of cells and a second contact tab electrically connected to a second one of said plurality of cells;
   a contact layer deposited on said plurality of cells, wherein a protruding section of said contact layer forms a first offset region, said first offset region including one of the first contact tab and the second contact tab;
   an insulating spacer layer deposited on the contact layer, said insulating spacer layer comprising a material selected to have a refractive index and thermal expansion coefficient closely matching a cell contacting the contact layer;
   a plurality of second cells selected from a group consisting of: a first group comprising an InGaP cell on a GaAsP cell, and a second group comprising an AlInP cell on InGaP cell, and
   a conductive layer, including a second offset region protruding from a stack formed from said plurality of second cells, said conductive layer positioned between the plurality of second cells and the insulating spacer layer, said second offset region incorporating a second grouping contact tab electrically connected to the plurality of second cells.

5. The multi-junction solar cell device of claim 4, wherein the InGaAs cell is bonded to the handle substrate by a layer transfer process from a donor film.

6. A multi-junction solar cell device comprising:
   a handle substrate;
   a cell grouping comprising:
      an InGaAs cell formed on a donor film and wafer-bonded to the handle substrate; and
      at least one of: an InP cell, and an InGaAsP cell, wherein a wafer-bonded tunnel junction is formed between adjacent ones of the cells in the cell grouping; and
   a first tab electrically connected to a topmost cell of said cell grouping and a second tab electrically connected to the InGaAs cell;
   an electrically conductive layer deposited on the most cell of the cell grouping, said electrically conductive layer forming an offset region protruding from the cell grouping, wherein the first tab is formed on the offset region;
   an insulating spacer layer formed on said electrically conductive layer, said insulating spacer layer comprising a material selected to have a refractive index and thermal expansion coefficient that closely matches the topmost cell of said cell grouping;
   a second conductive layer formed on the insulating spacer layer, said second conductive layer comprising a second offset region;
   a second cell grouping formed on said second conductive layer, other than said second offset region, said second cell grouping selected from a group consisting of: a first group comprising an InGaP cell on a GaAsP cell, and a second group comprising an AlInP cell on an InGaP cell, said second offset region, extending from the second cell grouping, comprising a second cell grouping contact tab electrically connected to the second cell grouping.

7. The multi-junction solar cell device of claim 6, wherein the donor film is a transfer film.

8. A multi-junction solar cell device comprising:
   a handle substrate;
   a first cell group comprising an InGaAs cell, grown on a donor film, and a cell selected from a group consisting of: an InP cell, and an InGaAsP cell, wherein the InGaAs cell is layer transferred to the handle substrate,
   a first contact tab electrically connected to the cell selected from the group consisting of: the InP cell and the InGaAsP cell, and a second contact tab electrically connected to said InGaAs cell;
   an electrically conductive layer comprising an offset region protruding from the cell selected from the group consisting of: the InP cell and the InGaAsP cell, said electrically conductive offset region containing the first contact tab;
   an insulating spacer layer formed on the electrically conductive layer, said insulating spacer layer comprising a material selected to have a refractive index and thermal expansion coefficient closely matching the cell selected from the group consisting of: the InP cell and the InGaAsP cell adjacent to said electrically conductive layer;
   a second cell group selected from a group consisting of: an InGaP cell on a GaAsP cell, and an AlInP cell on an InGaP cell, and a second conductive layer formed on a surface of the insulating spacer layer wherein the second cell group is positioned on the second conductive layer, said second conductive layer including a second offset region protruding from the second cell group, said second offset region incorporating thereon, a second group contact tab electrically connected to the second cell group.

9. A solar cell comprising:
a first cell comprising;
   an InGaAs cell and at least one of: an InGaAsP and an InP cell, wherein the InGaAs cell being formed on the handle substrate;
a separation layer, deposited on the first cell, comprising:
   a first metal layer formed on the first cell, a section of the first metal layer extending beyond said first cell, said extended section of the first metal layer forming a first offset region;
   an insulating spacer layer deposited on the first metal layer, said insulating spacer layer comprising a material selected to have a refractive index and thermal expansion coefficient closely matching a cell of said first cell adjacent to said first metal layer; and
   a second metal layer formed on a side of the insulating spacer layer opposite a side of the insulating spacer layer the first metal layer is located on, a section of said second metal layer extending beyond said second cell, said extended section of said second metal layer forming a second offset region; and
a second cell, formed on the second metal layer, comprising:
a second cell group selected from a group consisting of: an InGaP cell on a GaAsP cell and an AlInP cell on an InGaP cell, wherein
a first cell contact is formed on the first offset region; and
a second cell contact is formed on the second offset region.

* * * * *